United States Patent
Hu et al.

(10) Patent No.: US 12,300,639 B2
(45) Date of Patent: May 13, 2025

(54) SEAMLESS BONDING LAYERS IN SEMICONDUCTOR PACKAGES AND METHODS OF FORMING THE SAME

(71) Applicant: Taiwan Semiconductor Manufacturing Co., Ltd., Hsinchu (TW)

(72) Inventors: Chih-Chia Hu, Taipei (TW); Ming-Fa Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 573 days.

(21) Appl. No.: 17/580,942

(22) Filed: Jan. 21, 2022

(65) Prior Publication Data

US 2023/0139919 A1    May 4, 2023

Related U.S. Application Data

(60) Provisional application No. 63/275,538, filed on Nov. 4, 2021.

(51) Int. Cl.
  *H01L 23/00* (2006.01)
  *H01L 25/00* (2006.01)
  *H01L 25/065* (2023.01)

(52) U.S. Cl.
  CPC .............. *H01L 24/03* (2013.01); *H01L 24/05* (2013.01); *H01L 24/08* (2013.01); *H01L 24/80* (2013.01); *H01L 25/0657* (2013.01); *H01L 25/50* (2013.01); *H01L 2224/02206* (2013.01); *H01L 2224/03011* (2013.01); *H01L 2224/05647* (2013.01); *H01L 2224/08146* (2013.01); *H01L 2224/80007* (2013.01); *H01L 2225/06544* (2013.01); *H01L 2924/37001* (2013.01)

(58) Field of Classification Search
  CPC ......... H01L 24/03; H01L 24/05; H01L 24/08; H01L 24/80; H01L 24/09
  See application file for complete search history.

(56) References Cited

U.S. PATENT DOCUMENTS

| | | | | |
|---|---|---|---|---|
| 8,669,651 | B2 * | 3/2014 | Yang | H01L 25/105 257/737 |
| 10,163,769 | B2 * | 12/2018 | Tseng | H01L 24/17 |
| 10,861,814 | B2 * | 12/2020 | Lee | H01L 24/25 |
| 10,910,272 | B1 * | 2/2021 | Zhou | H10B 43/40 |
| 11,424,215 | B2 * | 8/2022 | Hou | H01L 23/53228 |

(Continued)

*Primary Examiner* — Mamadou L Diallo
(74) *Attorney, Agent, or Firm* — Slater Matsil, LLP

(57) ABSTRACT

Seamless bonding layers in semiconductor packages and methods of forming the same are disclosed. In an embodiment, a method includes forming a second passivation layer over a first metal pad and a second metal pad, the first metal pad and the second metal pad being disposed over a first passivation layer of a first semiconductor die; depositing a first bonding material over the second passivation layer to form a first portion of a first bonding layer, wherein at least a portion of a seam in the first bonding layer is between the first metal pad and the second metal pad; thinning the first portion of the first bonding layer to create a first opening from the seam; and re-depositing the first bonding material to fill the first opening and to form a second portion of the first bonding layer.

20 Claims, 20 Drawing Sheets

(56) References Cited

U.S. PATENT DOCUMENTS

| | | | |
|---|---|---|---|
| 11,694,977 B2* | 7/2023 | Katz | H01L 24/08 |
| | | | 257/774 |
| 2017/0194248 A1* | 7/2017 | Das | H01L 21/187 |
| 2018/0277354 A1* | 9/2018 | Chang | H01L 21/31116 |
| 2021/0066222 A1* | 3/2021 | Chen | H01L 23/5226 |
| 2023/0060360 A1* | 3/2023 | Seo | H01L 24/08 |
| 2023/0070532 A1* | 3/2023 | Park | H01L 24/03 |

* cited by examiner

SEAMLESS BONDING LAYERS IN SEMICONDUCTOR PACKAGES AND METHODS OF FORMING THE SAME

PRIORITY CLAIM AND CROSS-REFERENCE

This application claims benefit of U.S. Provisional Application No. 63/275,538, filed on Nov. 4, 2021, which application is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is system on integrated chip (SoIC) package technology. SoIC technology integrates both homogeneous and heterogeneous chiplets into a single system-on-a-chip (SoC)-like chip with a smaller footprint and thinner profile.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
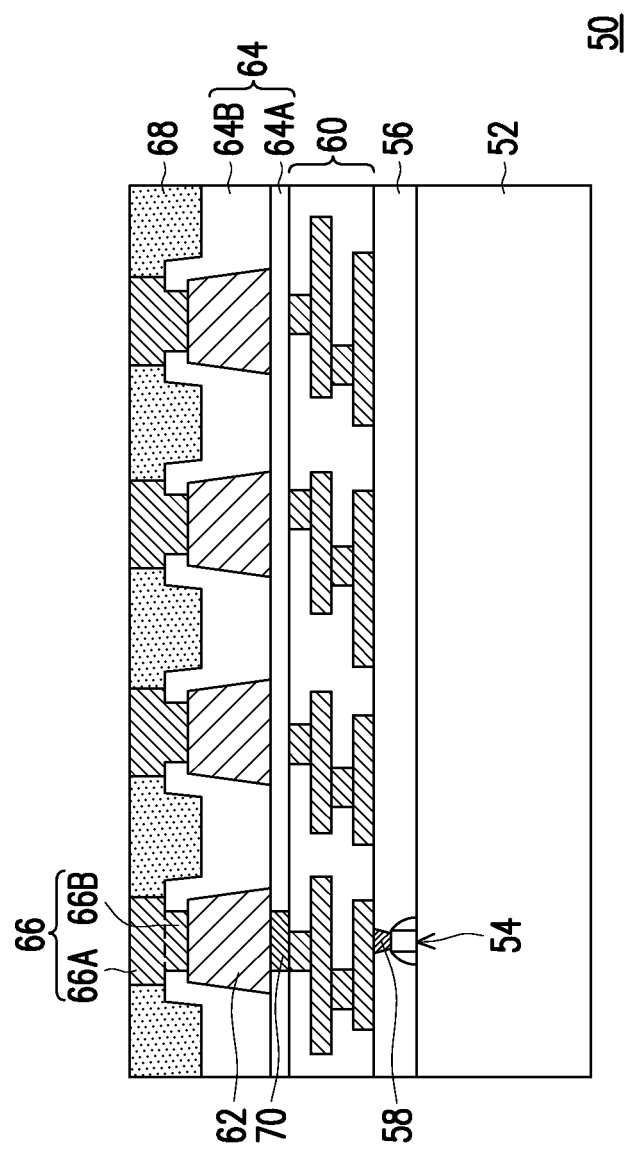
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a bonding layer containing no seams is provided in integrated circuit dies and/or die stacks directly bonded thereto. For example, an additional thinning process may be used to create an opening from a seam previously formed in a bonding layer above a passivation layer. The bonding material may then be re-deposited to fill the opening. In another example, before the bonding layer is deposited, the passivation layer is formed such that the top edge of the passivation layer is completely above the top edges of the metal pads electrically connected to the semiconductor device of the die. Various embodiments may achieve one or more of the following, non-limiting advantages: improved mechanical endurance; improved electrical performance; reduced defects; and increased yield.

Various embodiments are described below in a particular context. Specifically, a chip on wafer on substrate type SoIC package is described. However, various embodiments may also be applied to other types of packaging technologies, such as, integrated fan-out (InFO) packages, or the like.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side (e.g., the same side of the semiconductor substrate 52 as the devices 54), and an inactive surface (e.g., the surface facing downwards in FIG.

1), sometimes called a back side (e.g., the opposite side of the semiconductor substrate 52 to the devices 54).

The devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. Passivation layers 64 are on the integrated circuit die 50, such as on portions of the interconnect structure 60 and pads 62. According to some embodiments, the passivation layers 64 may include two passivation layers: a first passivation layer 64A and a second passivation layer 64B, details of which will be described below. Although the second passivation layer 64B is illustrated as being a monolayer, in some embodiments, the second passivation layer 64B may include one or more sublayers (e.g., three sublayers) deposited using materials such as the ones described below with respect to FIGS. 3A-3C, and 18. Openings extend through at least a portion of the passivation layers 64 (e.g., the passivation layer 64A) to the pads 62. Conductive vias 70 may be formed in the openings, and the pads 62 are electrically connected to the devices 54 by the vias 70 and the interconnect structure 60.

Die connectors 66, such as conductive pillars (for example, formed of a metal such as copper), may extend through the openings in the passivation layers 64 (e.g., in the passivation layer 64B) and may be physically and electrically coupled to respective ones of the pads 62. The die connectors 66 may be formed by, for example, plating, or the like. The die connectors 66 electrically couple the respective integrated circuits of the integrated circuit die 50. In some embodiments, each of the die connectors 66 may include a bonding pad 66A and a bonding via 66B physically and electrically coupled to a respective one of the pads 62. In some other embodiments, some die connectors 66 may include the bonding pads 66A and bonding vias 66B. Other die connectors (not shown) may only include the bonding pads 66A without the bonding vias 66B. These die connectors without the bonding vias 66B may serve as dummy die connectors that provide a balanced structure support for the integrated circuit die 50.

The die connectors 66 may be surrounded by dielectric layers 68, which laterally encapsulate the die connectors 66, and are laterally coterminous with the integrated circuit die 50. In subsequent processing steps, the die connectors 66 and the dielectric layers 68 may be used to directly bond the integrated circuit die 50 to another package component (e.g., an interposer structure). Accordingly, the dielectric layers 68 may also be referred to as bonding layers 68 and may be made of any suitable material for direct bonding such as an oxide (e.g., silicon oxide), a nitride (e.g., silicon nitride), an oxynitride (e.g., silicon oxynitride), or the like. The bonding layers 68 may be formed, for example, by spin coating, chemical vapor deposition (CVD), atomic layer deposition (ALD), or the like. The bonding layers 68 may include one or more bonding layers, such as a first bonding layer, a second bonding layer, and a third bonding layer, details of which will be described below.

Figure 2:
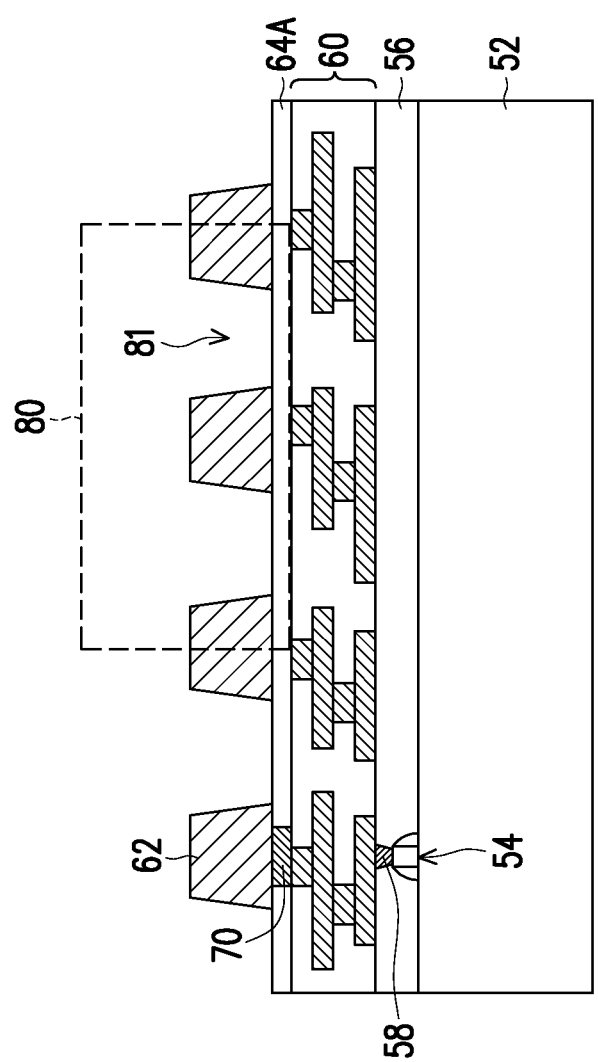
FIGS. 2 through 14 illustrate cross-sectional views of intermediate steps for forming a semiconductor package in accordance with some embodiments.

FIGS. 2 through 14 illustrate cross-sectional views of intermediate steps for forming a semiconductor package in accordance with some embodiments. In FIG. 2, pads 62 are formed over the first passivation layer 64A of the passivation layers 64. The first the passivation layer 64A may include non-organic dielectric materials such as silicon oxide (e.g., silicon dioxide ($SiO_2$)), silicon nitride (SiN), the like, or combinations thereof. The first the passivation layer 64A may be deposited by, for example, CVD, PVD, ALD, the like, or combinations thereof. The pads 62 may include metallic material such as aluminum, or the like. The pad 62 may be electrically connected to the metallization pattern of the underlying interconnect structure 60 using, for example, a conductive via 70, which extends through the first passivation layer 64A.

Figure 3A:
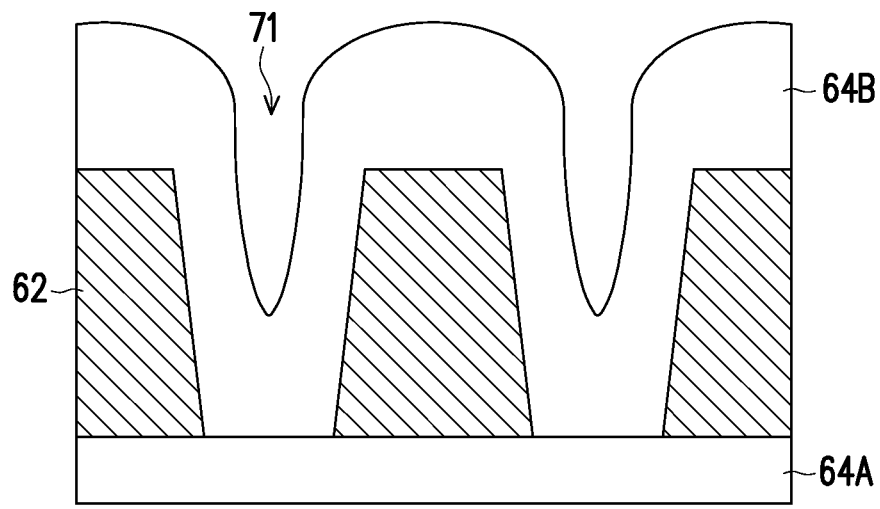

Next, the second passivation layer 64B may be deposited over the pads 62 and over the first passivation layer 64A. For the ease of explanation, section 80 of FIG. 2 is magnified and shown in FIGS. 3 through 14. The processes described with respect section 80 are applicable to other corresponding sections of the integrated circuit dies 50 that include and are above the first passivation layer 64A. The second the passivation layer 64B shown in FIG. 3A may include non-organic dielectric materials such as silicon oxide, SiN, the like, or combinations thereof. The second the passivation layer 64B may be deposited by, for example, CVD, high density plasma CVD (HDP-CVD), PVD, ALD, the like, or combinations thereof. As illustrated in FIG. 3A, between two neighboring pads 62, there is an opening 71 in the second passivation layer 64B. Because the height-to-width ratio of an opening 81 between two pads 62 is relatively high, the height-to-width ratio of the opening 71 is relatively high. Here, the height of an opening 81 may be the vertical distance between the top edge of the pad 62 and the bottom edge of the pad 62. The width of the opening 81 may be the width of the widest portion of the opening 81. The height of the opening 71 between two pads 62 may be the vertical distance between the highest point of the second passivation layer 64B above the two pads 62 and the lowest point of the opening 71. The width of the opening 71 may be the width of the widest portion of the opening 71. In some embodiments, the height-to-width ratio of the opening 81 between two pads 62 may be about or above 1. In some embodiments, the height-to-width ratio of the opening 71 may be about or above 3.

Figure 3B:
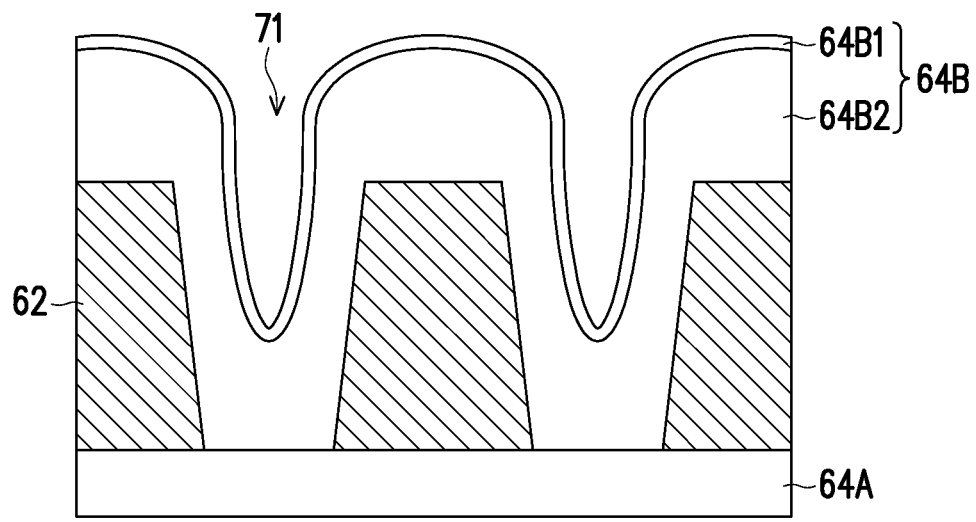

The second the passivation layer 64B in FIG. 3A may include one or more sublayers. In some embodiments, as shown in FIG. 3B, the second the passivation layer 64B may include two sublayers: sublayer 64B1 and sublayer 64B2. The sublayer 64B2 may include silicon oxide (e.g., silicon dioxide (SiO$_2$)), or the like. The sublayer 64B2 may be deposited over the pads 62 and over the first passivation layer 64A by HDP-CVD. The sublayer 64B1 may include silicon nitride (SiN), or the like. The sublayer 64B1 may be deposited over the sublayer 64B2 by CVD. The sublayer 64B1 may serve as an etching stop layer.

Figure 3C:
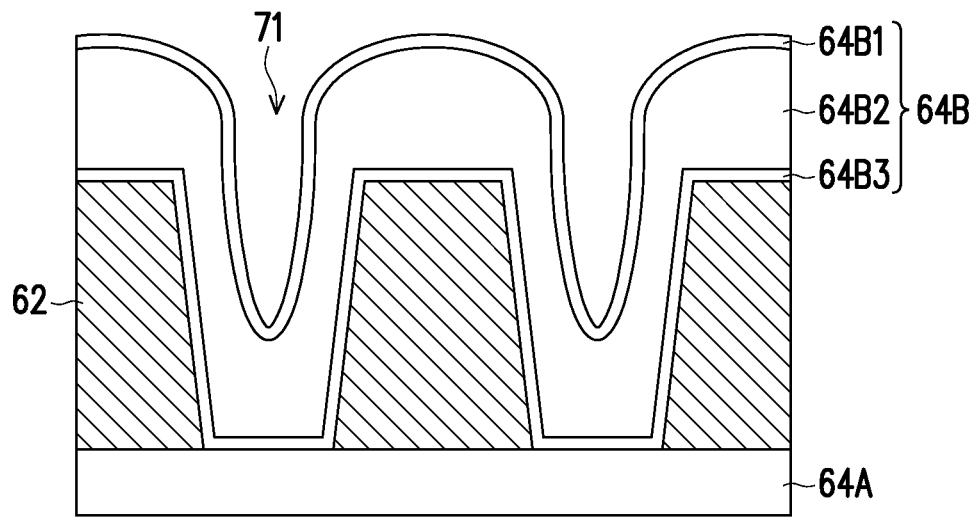

In some other embodiments, as shown in FIG. 3C, the second the passivation layer 64B may include three sublayers: the sublayer 64B1, the sublayer 64B2, and the sublayer 64B3. The sublayer 64B3 may include silicon oxide (e.g., silicon dioxide (SiO$_2$)), or the like. The sublayer 64B3 may be deposited over the pads 62 and over the first passivation layer 64A by CVD or the like. The sublayer 64B2 may include silicon oxide (e.g., silicon dioxide (SiO$_2$)), or the like. The sublayer 64B2 may be deposited over the sublayer 64B3 by HDP-CVD. The density of the sublayer 64B2 may be higher than that of the sublayer 64B3. The sublayer 64B1 may include silicon nitride (SiN), or the like. The sublayer 64B1 may be deposited over the sublayer 64B2 by CVD.

For ease of explanation, the techniques described below with respect to FIGS. 4A through 14 are shown as applied to the scenarios where the second passivation layer 64B includes two sublayers. The techniques described with respect to FIGS. 4A through 14 may also be applied to the scenarios regardless the number of sublayers in the second the passivation layer 64B.

Figure 4A:
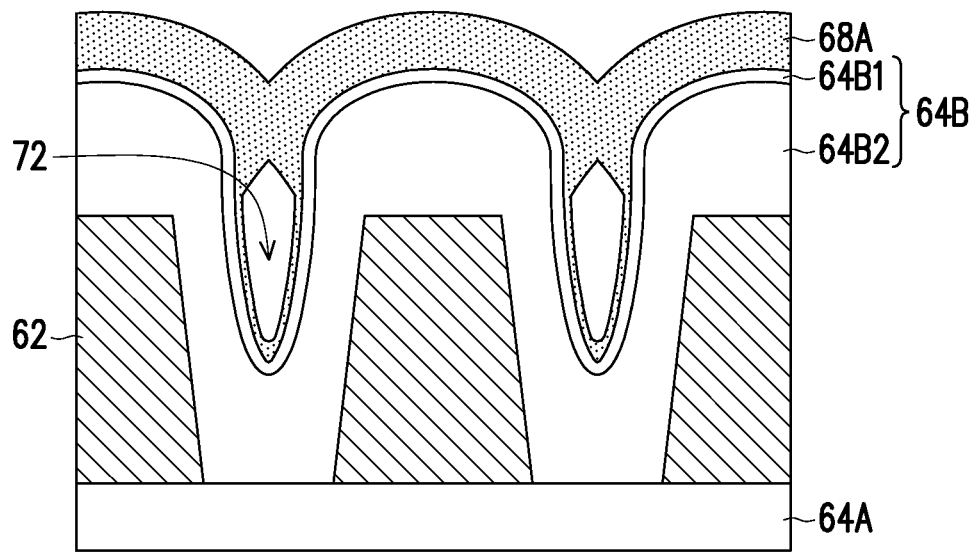

In FIG. 4A, the first bonding layer 68A of the bonding layers 68 is deposited over the second passivation layer 64B. In some embodiments, the first bonding layer 68A may comprise silicon oxide (e.g., silicon dioxide (SiO$_2$)), silicon nitride (SiN), or silicon oxynitride (SiON), the like, or combinations thereof, and may be deposited by CVD, ALD, PVD, the like, or combinations thereof. Because the height-to-width ratios of the openings 71 are relatively high, after the first bonding layer 68A is deposited over the second passivation layer 64B, seams 72 (e.g., defining voids) are formed inside and enclosed by the first bonding layer 68A. For example, due to the relatively high height-to-width ratios of the openings 71, the first bonding layer 68A may accumulate at tops of the openings 71 during deposition, pinching off the seams 72, and defining undesirable voids. These seams in the first bonding layer 68A are potentially risky for packages, such as SoIC and chip package interaction (CPI) as they may result in poor bonding and manufacturing defects.

Figure 4B:
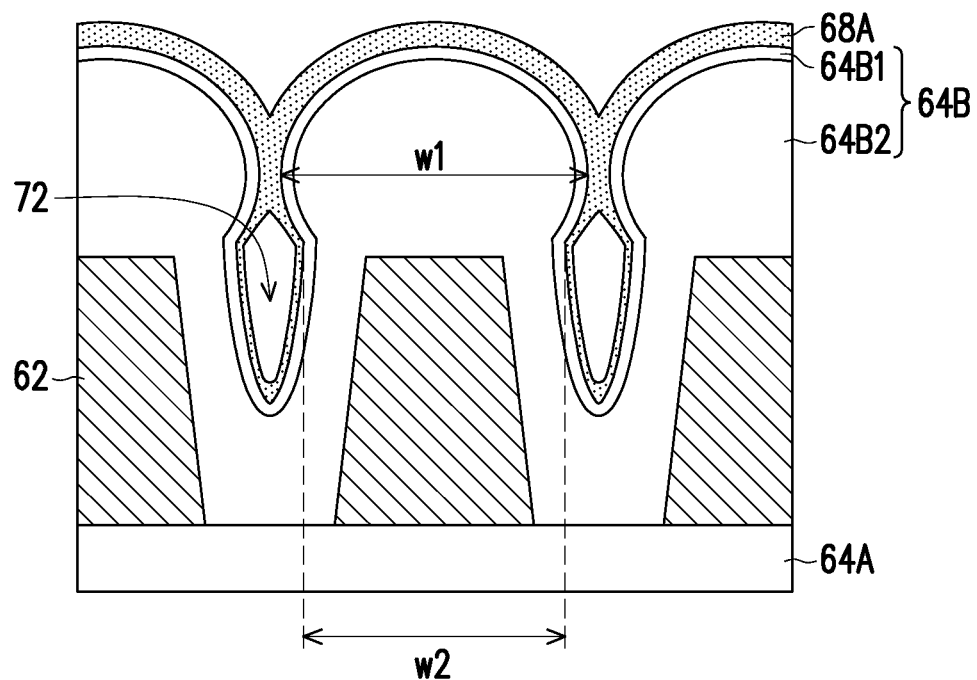

FIG. 4B shows additional embodiments after the first bonding layer 68A of the bonding layers 68 is deposited over the second passivation layer 64B. FIG. 4B may be similar to FIG. 4A except that the width (e.g., w1) of an upper portion of the second passivation layer 64B is greater than the width (e.g., w2) of a middle portion of the second passivation layer 64B. The shape of the second passivation layer 64B shown in FIG. 4B may result from tuning one or more process parameters during the deposition process, such as, applying a less strong magnetic field and/or applying a narrower range of plasma in the PVD chamber than the ones used for depositing the second passivation layer 64B shown in FIG. 4A. Such shape of the second passivation layer 64B may more likely lead to forming the seams 72 (e.g., the first bonding layer 68A more likely accumulating at tops of the openings during deposition and pinching off the seams 72).

For ease of explanation, the techniques described below are shown using the shape of the second passivation layer 64B shown in FIG. 4A as an example. The techniques described below may also be applied to the scenarios with the shape of the second passivation layer 64B shown in FIG. 4B.

Figure 5:
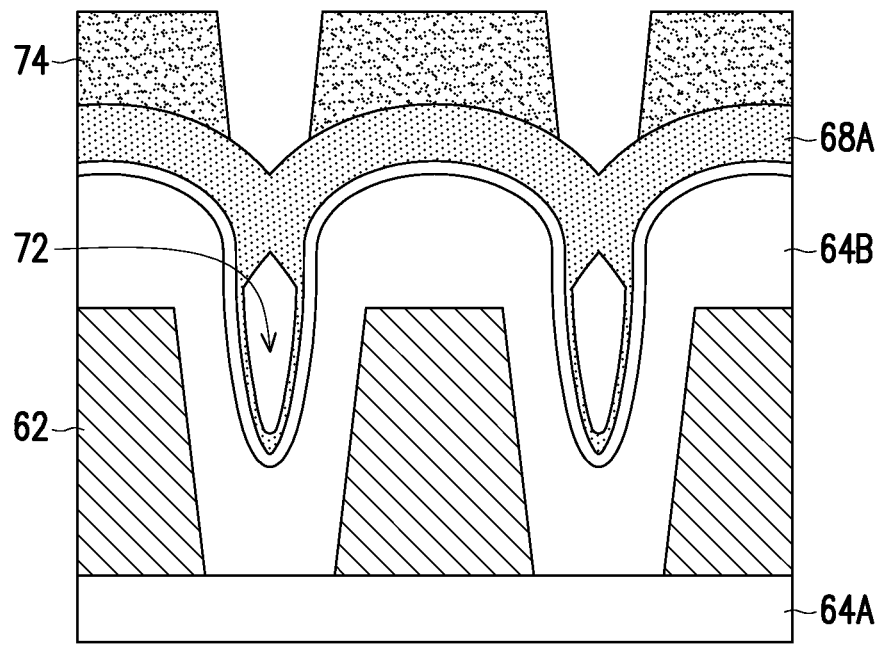

To remove the seams 72, an additional thinning process may be applied to the first bonding layer 68A. First, as shown in FIG. 5, an etching mask 74 is formed and patterned on the first bonding layer 68A. The etching mask 74 may be a photoresist formed by spin coating or the like and may be exposed to light for patterning. In some embodiments, the etching mask 74 may be a single-layer hard mask or a multi-layer hard mask that are patterned by a patterned photoresist. The pattern of the etching mask 74 corresponds to the location of the seams 72. The patterning may form openings that overlap the seams 72 through the etching mask 74 and expose the portions of the first bonding layer 68A that are above the seams 72.

Figure 6:
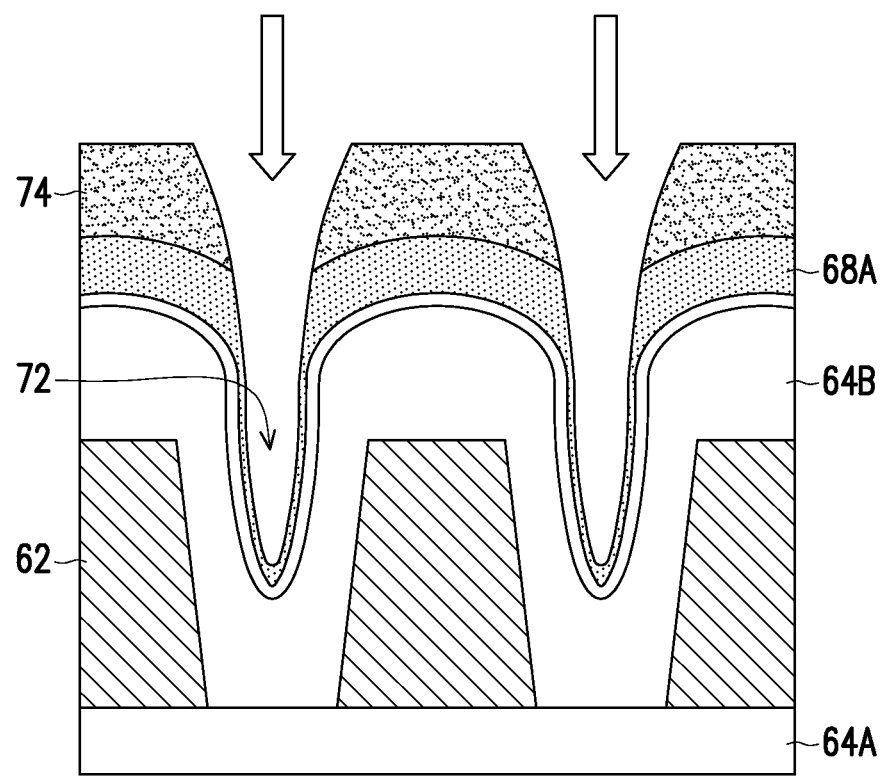

In FIG. 6, once the etching mask 74 is patterned, a thinning process may be applied to the first bonding layer 68A through the openings in the etching mask 74 to create openings 73 from the seams 72. The openings 73 may be created using any suitable etching process. For example, the etching process may include a dry etching process using reaction gas(es) that selectively etch the first bonding layer 68A at a faster rate than the etching mask 74. In some embodiments, the dry etching process may be timed. In some other embodiments, using the N-point mode, the dry etching process may continue until the atom signal of the second passivation layer 64B is detected. After the thinning process, the etching mask 74 may be removed by an acceptable ashing or stripping process. The etching process may widen the width of the openings 73 to be larger than the width of the openings 71. Further, portions of the first bonding layer 68A deposited at the bottom of the openings 71 may provide the openings 73 that are less deep than the openings 71. So, the openings 73 may have a lower height-to-width ratio than the openings 71.

Figure 7:
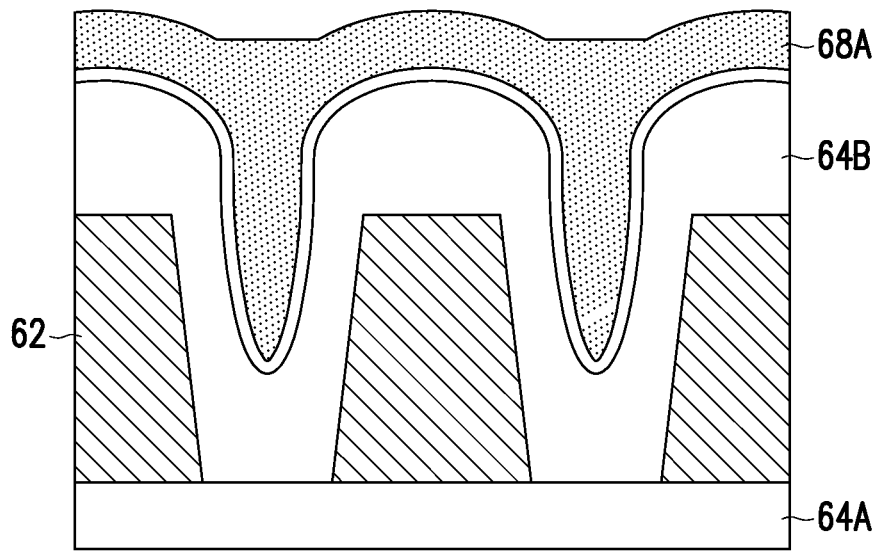

In FIG. 7, the bonding material (e.g., silicon oxide, silicon nitride, or Silicon oxynitride, the like, or combinations thereof) for the first bonding layer 68A may be re-deposited to fill the openings 73 and to form an additional portion of the first bonding layer 68A. The bonding material may be re-deposited by CVD, ALD, PVD, or the like. After the bonding material is re-deposited, there is no seam in the first bonding layer 68A and between the pads 62. In some embodiments, the first bonding layer 68A is free of any seams between any two of the pads 62. By eliminating such seams, the embodiment techniques help improve bonding quality of subsequently formed packages and reduce manufacturing defects.

Figure 8:
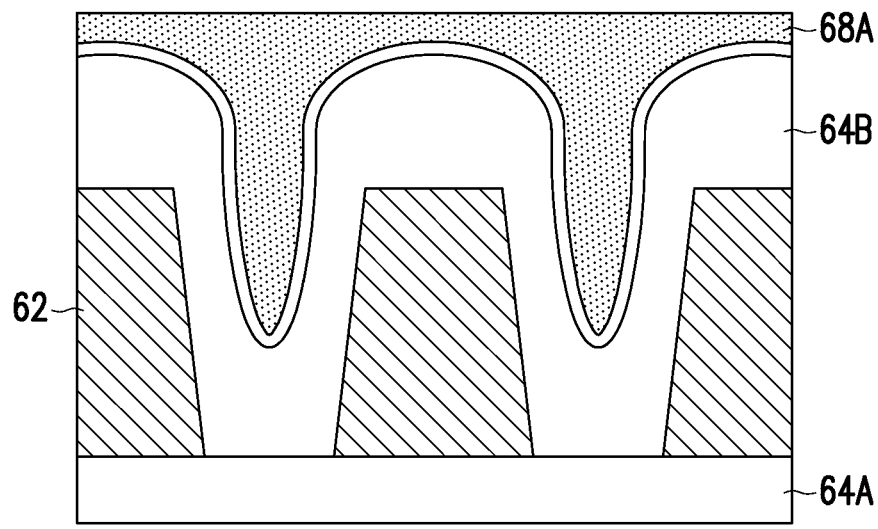

In FIG. 8, a thinning process may be applied to the first bonding layer 68A. The thinning process may be a planarization process such as a chemical mechanical polish (CMP), an etch-back, combinations thereof, or the like. After planarization, a top surface of the first bonding layer 68A may be flat.

Figure 9:
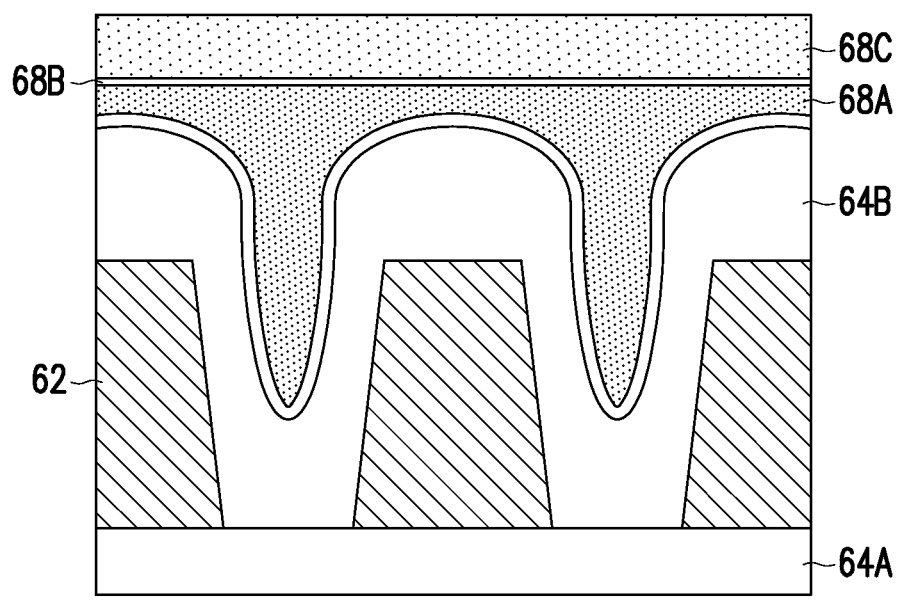

In FIG. 9, a second bonding layer 68B of the bonding layers 68 may be deposited on the first bonding layer 68A. In some embodiments, the second bonding layer 68B may comprise silicon oxide (e.g., silicon dioxide (SiO$_2$)), silicon nitride (SiN), silicon oxynitride (SiON), the like, or combinations thereof, that may be deposited by CVD, ALD, PVD, or the like. The second bonding layer 68B may serve as an etching stop layer. Then, as also illustrated by FIG. 9, a third bonding layer 68C of the bonding layers 68 may be deposited on the second bonding layer 68B. The third bonding layer 68C may be a layer made of silicon oxide (e.g., silicon dioxide (SiO$_2$)), silicon nitride (SiN), or silicon oxynitride (SiON), the like, or combinations thereof, that may be formed on the second bonding layer 68B using, for example, CVD, ALD, PVD, thermal oxidation, or the like. In some embodiment, the second bonding layer 68B and the third bonding layer 68C may have different material compositions such that the third bonding layer 68C may be selectively etched (e.g., etched at a higher rate relative to a same etch process) from the second bonding layer 68B. For example, the second bonding layer 68B may include silicon oxide (e.g., silicon dioxide ($SiO_2$)), silicon nitride (SiN), the like, or combinations thereof, and the third bonding layer 68C may include silicon oxide. Other suitable materials may be used for the second bonding layer 68B and the third bonding layer 68C.

A surface treatment may be applied to one or more of the second bonding layer 68B and the third bonding layer 68C. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the second bonding layer 68B and the third bonding layer 68C.

Figure 10:
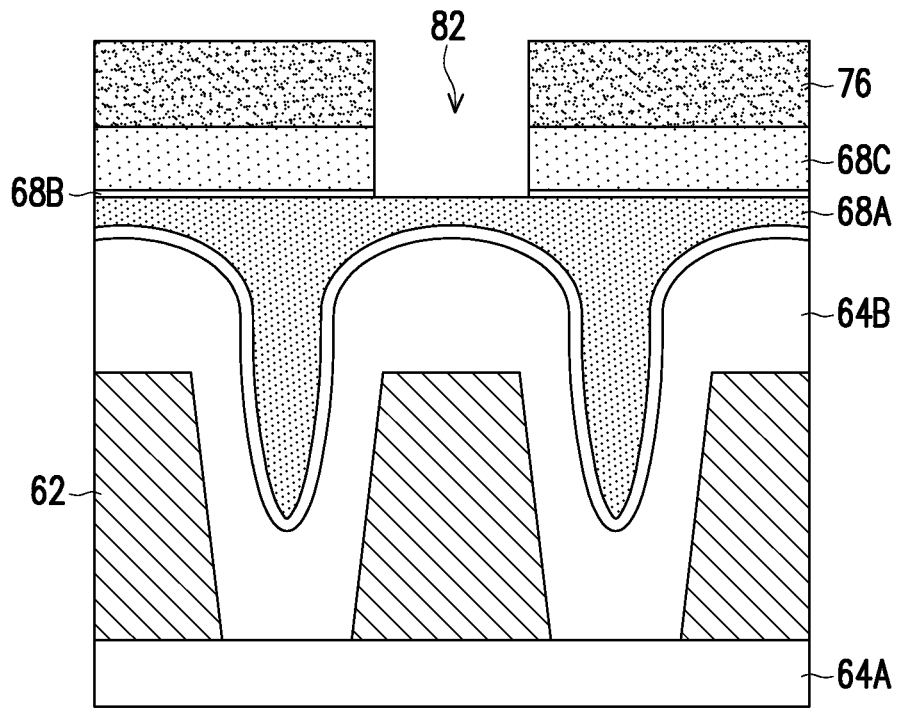

In FIG. 10, an etching mask 76 is formed and patterned on the third bonding layer 68C. The etching mask 76 may be formed by spin coating or the like and may be exposed to light for patterning. The openings the etching mask 76 correspond to bonding pads 66A and overlap some of the pads 62. The patterning may form openings that overlap some of the pads 62 through the etching mask 76 and expose the portions of the third bonding layer 68C above some of the pads 62. Once the etching mask 76 is patterned, an etching process may be applied to the third bonding layer 68C and the second bonding layer 68B through the openings in the etching mask 76 to create openings 82 through the etching mask 76, the third bonding layer 68C, and the second bonding layer 68B. The openings 82 may be created using any suitable etching process. For example, the etching process may include a dry etching process using reaction gas(es) that selectively etch the third bonding layer 68C at a faster rate than the second bonding layer 68B. The openings may then be etched through the second bonding layer 68B using a separate etching process to expose the first bonding layer 68A. After the etching process, the openings 82 through the etching mask 76 are also through the third bonding layer 68C and the second bonding layer 68B. In some embodiments, the dry etching process may be timed until the portions of the first bonding layer 68A are exposed by the openings 82.

Figure 11:
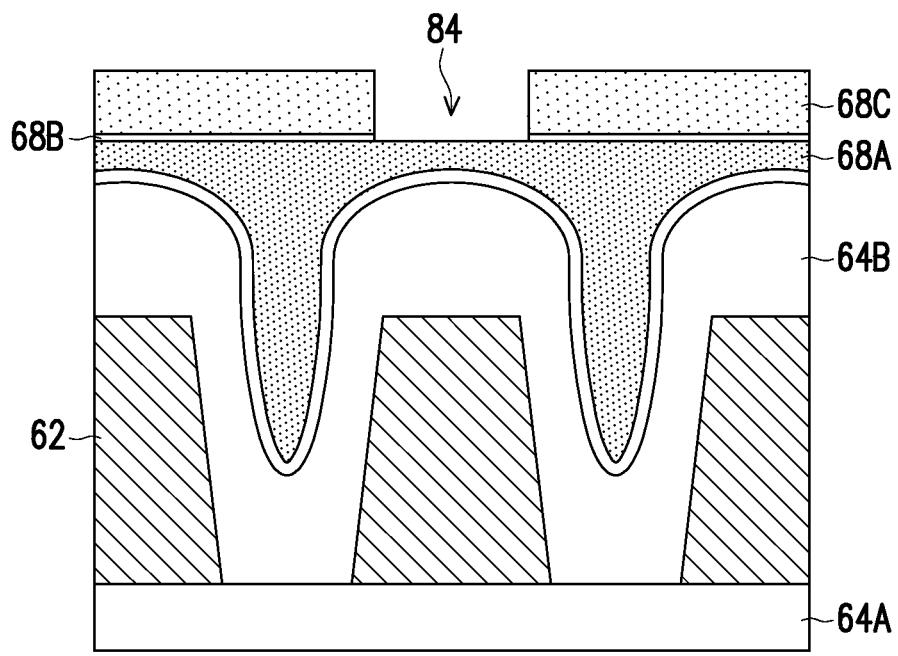

In FIG. 11, the etching mask 76 may be removed by an acceptable ashing or stripping process (such as using an oxygen plasma or the like) after the openings 82 are created. After removal of the etching mask 76, the openings 82 become openings 84 through the third bonding layer 68C and the second bonding layer 68B.

Figure 12:
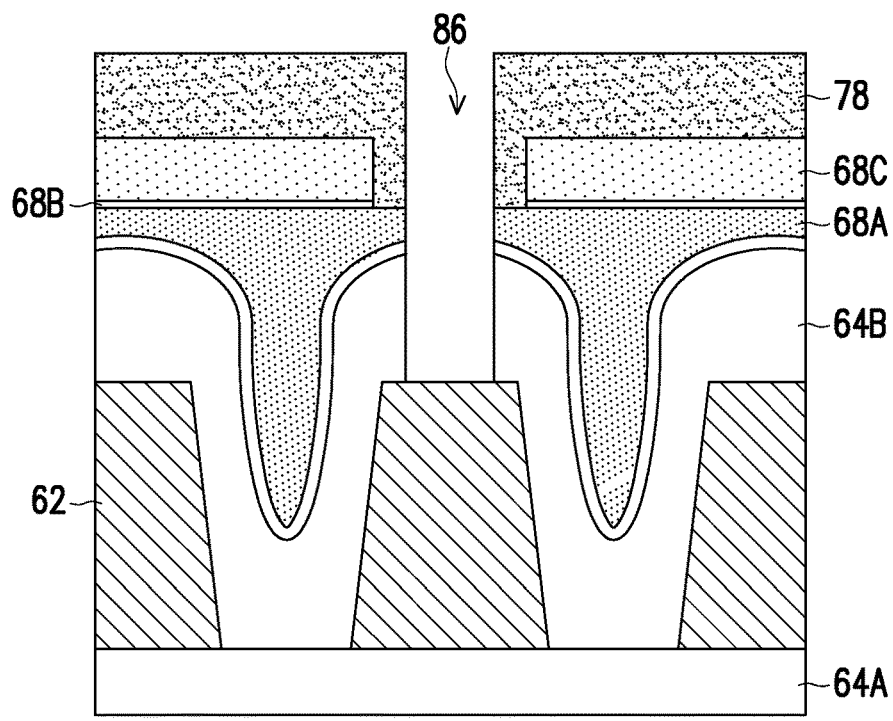

In FIG. 12, an etching mask 78 may be formed on the third bonding layer 68C and in the openings 84 by spin coating or the like. The etching mask 78 may then be exposed to light for patterning. The openings in the etching mask 78 correspond to bonding vias 66B and overlap some of the pads 62. The patterning may form openings 86 in the etching mask 78 that overlap some of the pads 62. The openings in the etching mask 78 formed by the patterning may be narrower than the openings 82 as shown in FIG. 10. Also as shown in FIG. 12, the vertical sides of the third bonding layer 68C and the second bonding layer 68B facing the openings 86 in the etching mask 78 may be covered by the etching mask 78. Once the etching mask 78 is patterned, an etching process may be applied to the first bonding layer 68A and the second passivation layer 64B through the openings in the etching mask 78 to create openings 86 through the etching mask 78, the third bonding layer 68C, the second bonding layer 68B, the first bonding layer 68A, and the second passivation layer 64B. The openings 86 may be created using any suitable etching process. For example, the etching process may include a dry etching process using reaction gas(es) that selectively etch the first bonding layer 68A at a faster rate than the second passivation layer 64B. The openings may then be etched through the second passivation layer 64B using a separate etching process to expose some of the pads 62. The openings 86 after the thinning process may be narrower and deeper than the openings 82 as shown in FIG. 10. In some embodiments, the dry etching process may be timed until portions of some of the pads 62 are exposed by the openings 86. Next, the etching mask 78 may be removed by an acceptable ashing or stripping process, such as using an oxygen plasma or the like.

Figure 13A:
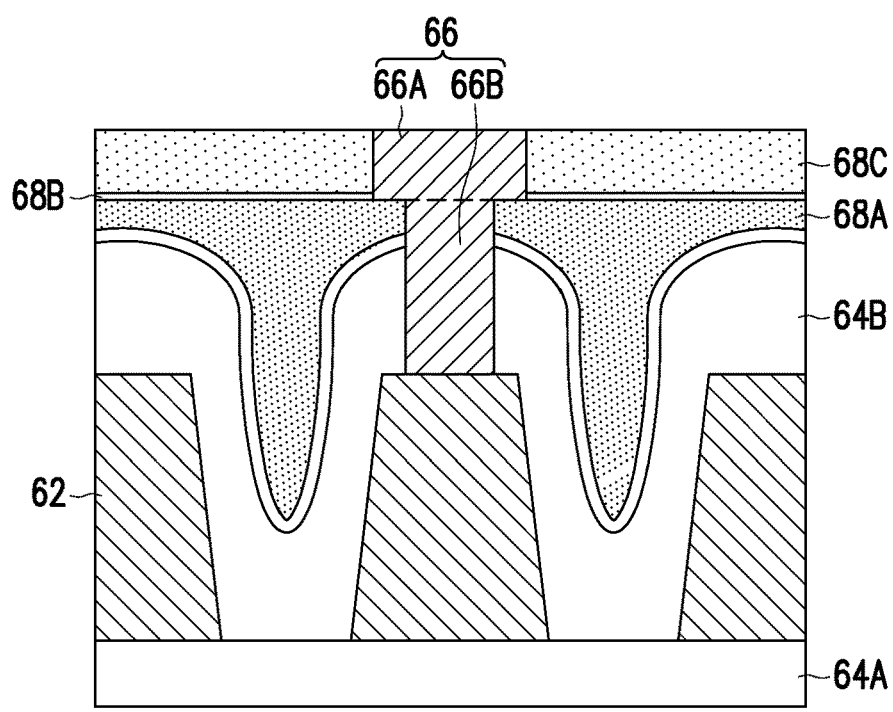

In FIG. 13A, the die connectors 66 (which may include the bonding pads 66A and bonding vias 66B) are formed on some of the pads 62. As an example of forming the connectors 66, a conductive material may be formed on the exposed portions of some of the pads 62 and in the openings through the third bonding layer 68C, the second bonding layer 68B, the first bonding layer 68A, and the second passivation layer 64. The conductive material may be formed by plating, such as electroplating or electroless plating, or the like. The conductive material may comprise a metal, like copper, titanium, tungsten, aluminum, or the like. Then, a thinning process may be applied to the bonding pads 66A and the third bonding layer 68C. The thinning process may be a planarization process such as a CMP, an etch-back, combinations thereof, or the like. After planarization, the top surfaces of the bonding pad 66A and the top surface of the third bonding layer 68C may be level.

Figure 13B:
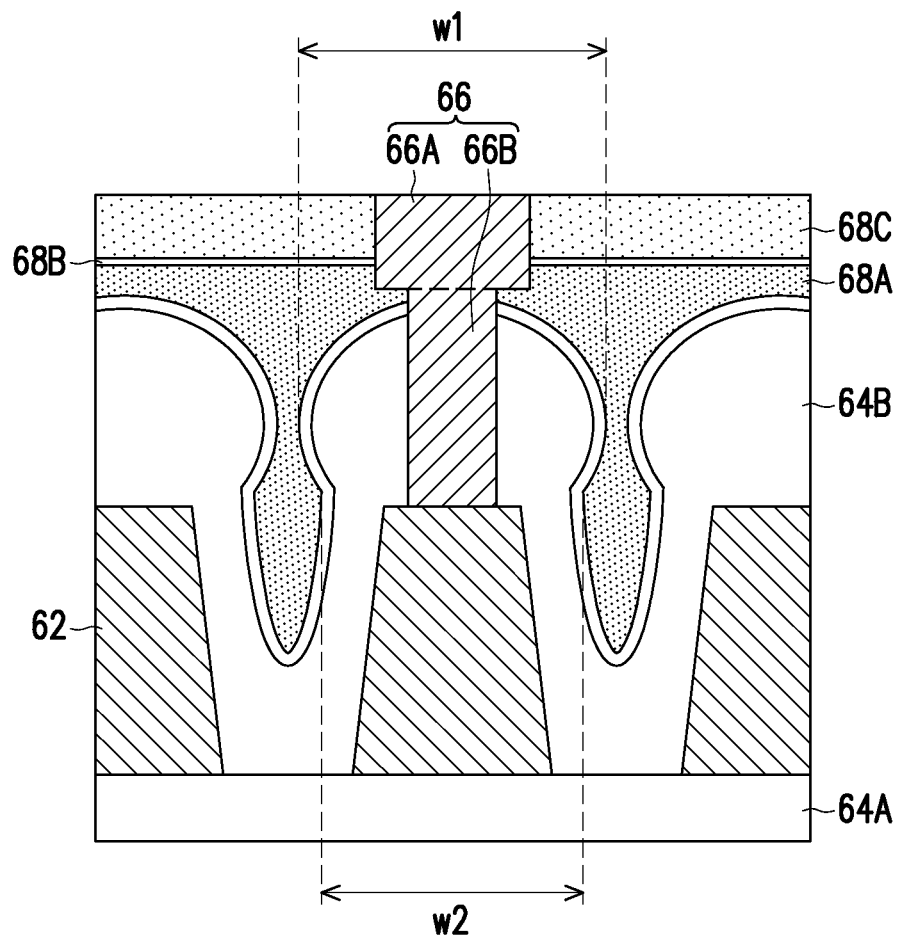

As explained above, the techniques described in this disclosure may also be applied to the scenarios with the shape of the second passivation layer 64B shown in FIG. 4B. FIG. 13B illustrates the cross-sectional view of an intermediate step using the techniques described above. FIG. 13B may be similar to FIG. 13A except that the width (e.g., w1) of the upper portion of the second passivation layer 64B is greater than the width (e.g., w2) of the middle portion of the second passivation layer 64B. As shown in FIG. 13B, the seams 72 shown in FIG. 4B can also be removed using techniques described in this disclosure.

Figure 14:
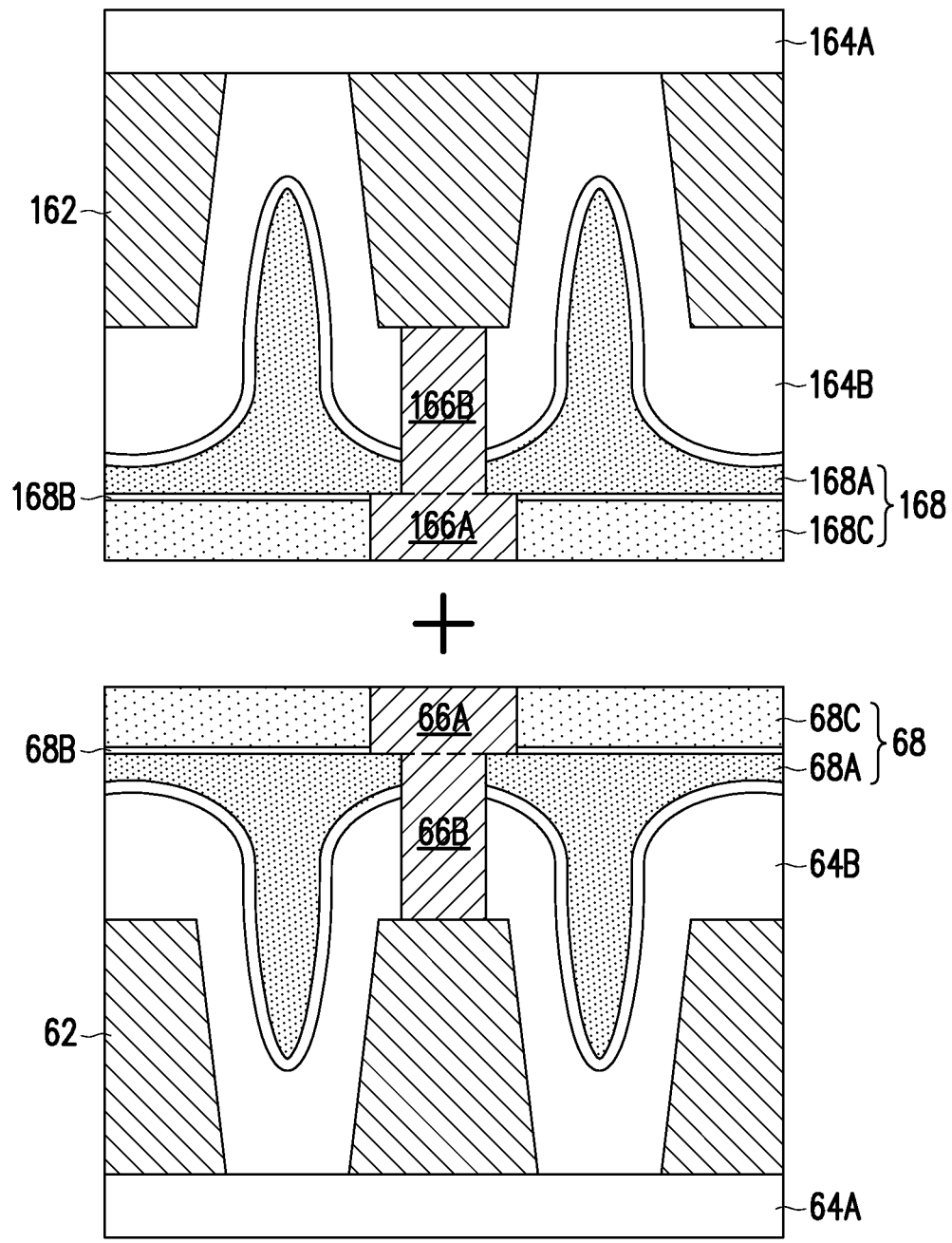
Figure 15:
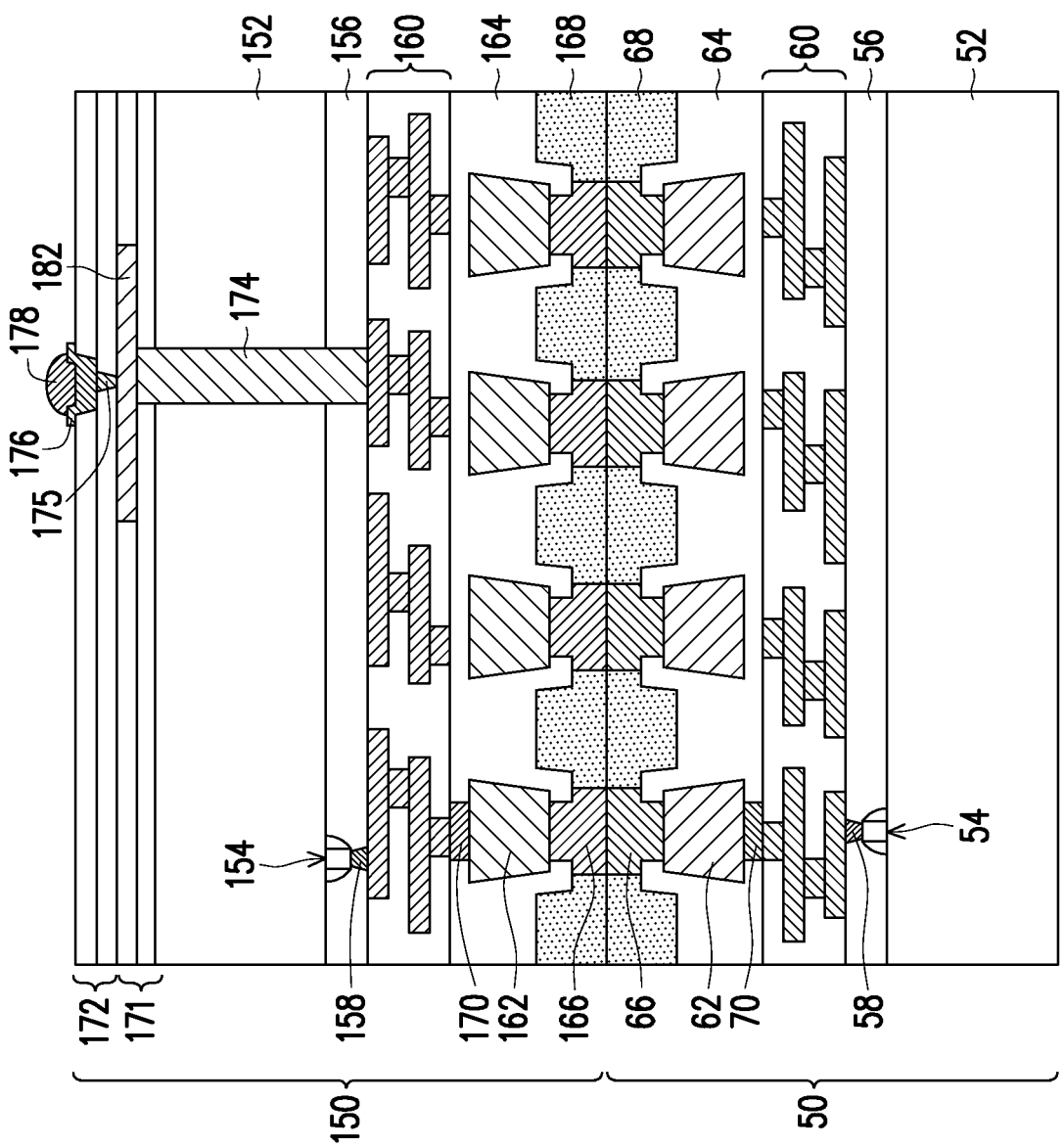
FIGS. 15 through 16 illustrate cross-sectional views of SoIC packages in accordance with some embodiments.

Next, as shown in FIG. 15, the integrated circuit die 50 and a second integrated circuit die 150 are bonded to each other through the die connectors 66 and 166 and through the bonding layers 68 and 168. FIG. 14 shows portions of the integrated circuit die 50 and the second integrated circuit die 150 to illustrate details of the bonding through the die connectors 66 and 166 and through the bonding layers 68 and 168. The integrated circuit die 50 may be bonded to the second integrated circuit die 150, for example, in a hybrid bonding configuration. The second integrated circuit die 150 may be disposed face down such that the front side of the second integrated circuit die 150 faces the front side of the integrated circuit die 50. The bonding layers 68 of the integrated circuit die 50 may be directly bonded to the bonding layers 168 of the second integrated circuit die 150. Die connectors 66 of the integrated circuit die 50 may be directly bonded to the die connectors 166 of the second integrated circuit die 150. In an embodiment, the bonds between the dielectric layers 68 of the integrated circuit die 50 and the dielectric layers 168 of the second integrated circuit die 150 are oxide-to-oxide bonds, or the like. The hybrid bonding process further directly bonds the die connectors 66 of the integrated circuit die 50 to the die connectors 166 of the second integrated circuit die 150 through direct metal-to-metal bonding. Thus, electrical connection between the integrated circuit die 50 and the second integrated circuit die 150 can be provided by the physical and electrical connection of the die connectors 66 and the die connectors 166.

As an example, the hybrid bonding process starts with applying a surface treatment to one or more of the bonding layers 68 and 168. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layers 68 and 168. The hybrid bonding process may then proceed to aligning the die connectors 66 of the integrated circuit die 50 to the die connectors 166 of the second integrated circuit die 150. When the integrated circuit die 50 and the second integrated circuit die 150 are aligned, the die connectors 66 of the integrated circuit die 50 may overlap with the corresponding die connectors 166 of the second integrated circuit die 150. Next, the hybrid bonding includes a pre-bonding step, during which the second integrated circuit die 150 is put in contact with the integrated circuit die 50 and respective die connectors 66 and 166. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in die connectors 66 (e.g., copper) and the metal of the die connectors 166 (e.g., copper) inter-diffuses to each other, and hence the direct metal-to-metal bonding is formed. Other direct bonding processes (e.g., using adhesives, polymer-to-polymer bonding, or the like) may be used in other embodiments.

Notably, the integrated circuit die 50 is bonded to the second integrated circuit die 150 without the use of solder connections (e.g., microbumps or the like). By directly bonding the integrated circuit die 50 to the second integrated circuit die 150, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die bonding may be achieved between the integrated circuit die 50 and the second integrated circuit die 150, which has the benefits of smaller form-factor, higher bandwidth, improved power integrity (PI), improved signal integrity (SI), and lower power consumption.

Back to FIG. 15, which shows a scheme of SoIC face-to-face (F2F) stacking of the second integrated circuit die 150 on the integrated circuit die 50, according to some embodiments. In F2F stacking, the front side of the integrated circuit die 50 is bonded to the front side of the second integrated circuit die 150. The integrated circuit die 50 and the second integrated circuit die 150 may be a logic device, such as a central processing unit (CPU), a graphics processing unit (GPU), a system-on-a-chip (SoC), a microcontroller, a memory device, such as a dynamic random access memory (DRAM) die, a static random access memory (SRAM) die, a hybrid memory cube (HMC) module, a high bandwidth memory (HBM) module, or the like. In some embodiments, the integrated circuit die 50 and the second integrated circuit die 150 may be the same type of dies, such as SoC dies. The integrated circuit die 50 and the second integrated circuit die 150 may be formed in processes of a same technology node, or may be formed in processes of different technology nodes. For example, the integrated circuit die 50 may be of a more advanced process node than the second integrated circuit die 150, and vice versa. The integrated circuit die 50 and the second integrated circuit die 150 may have different sizes (e.g., different heights and/or surface areas), or may have the same size (e.g., same heights and/or surface areas). Other combinations of integrated circuit dies are also possible in other embodiments.

In the second integrated circuit die 150, the semiconductor substrate 152, the devices 154, the ILD 156, the conductive plugs 158, the interconnect structure 160, the pads 162, the passivation layers 164, the die connectors 166, the bonding layers 168, and the vias 170 may be formed of a similar material and in similar ways to the semiconductor substrate 52, the devices 54, the ILD 56, the conductive plugs 58, the interconnect structure 60, the pads 62, the passivation layers 64, the die connectors 66, the bonding layers 68, and the vias 70 of the integrated circuit die 50, respectively.

The second integrated circuit die 150 may further include through substrate vias (TSVs) 130, which may be through the semiconductor substrate 152 and the ILD 156. The TSVs 130 may be touching and electrically connected to the interconnect structure 160. The TSVs 130 may comprise a conductive material (e.g., copper, or the like). Two or more stacked dielectric layers 171 may be formed around top portions of the through vias 130. One or more layers of conductive features 182 may be formed in the two or more stacked dielectric layers 171. Each of the stacked dielectric layers 171 may comprise a dielectric material, such as a low-k dielectric material, an extra low-k (ELK) dielectric material, or the like. The stacked dielectric layers 171 may be deposited using an appropriate process, such as, CVD, ALD, PVD, PECVD, or the like.

The conductive features 182 may comprise conductive lines and/or conductive vias interconnecting the layers of conductive lines. The conductive vias may extend through respective ones of the stacked dielectric layers 171 to provide vertical connections between layers of the conductive lines. The conductive features 182 and the TSVs 174 may be formed through any acceptable process, such as, a damascene process, a dual damascene process, or the like.

In some embodiments, the conductive features 182 may be formed using a damascene process in which a respective dielectric layer 171 is patterned utilizing a combination of photolithography and etching techniques to form trenches corresponding to the desired pattern of the conductive features 182. An optional diffusion barrier and/or optional adhesion layer may be deposited and the trenches may then be filled with a conductive material. In an embodiment, the conductive features 182 may be formed by depositing a seed layer of copper or a copper alloy, and filling the trenches by electroplating. A chemical mechanical planarization (CMP) process or the like may be used to remove excess conductive material from a surface of the respective dielectric layer 171 and to planarize surfaces of the stacked dielectric layers 171 and the conductive features 182 for subsequent processing.

In some embodiments, the TSVs 174 may be formed using another damascene process in which a respective dielectric layer 171, the semiconductor substrate 152, and the ILD 156 are patterned utilizing a combination of photolithography and etching techniques to form trenches corresponding to the desired pattern of the TSVs 174. An optional diffusion barrier and/or optional adhesion layer may be deposited and the trenches may then be filled with a conductive material. In an embodiment, the TSVs 174 may be formed by depositing a seed layer of copper or a copper alloy, and filling the trenches by electroplating.

FIG. 15 illustrates one layer of the conductive features 182 and two layers of the stacked dielectric layers 171 on the back side of the second integrated circuit die 150. However, it should be appreciated that the second integrated circuit die 150 may comprise any number (e.g., N) of layers of the conductive features 182, disposed in any number (e.g. N+1) of layers of the stacked dielectric layers 171.

Passivation layers 172, vias 175, UBMs 176, and external connectors 178 may be formed over the stacked dielectric layers 171 and the conductive features 182. The passivation layers 172 may comprise polymers such as PBO, polyimide, BCB, or the like. Alternatively, the passivation layers 172 may include non-organic dielectric materials such as silicon oxide, silicon nitride, silicon carbide, silicon oxynitride, or the like. The passivation layers 172 may be deposited by, for example, CVD, PVD, ALD, or the like.

The UBMs 176 may be formed through the passivation layers 172 to the conductive features 182 and external connectors 178 are formed on the UBMs 176. The UBMs 176 may comprise one or more layers of copper, nickel, gold, or the like, which are formed by a plating process, or the like. The external connectors 178 (e.g., solder balls) are formed on the UBMs 176. The formation of the external connectors 178 may include placing solder balls on exposed portions of the UBMs 176 and reflowing the solder balls. The UBMs 176 and the external connectors 178 may be used to provide input/output connections to other electrical components, such as, other device dies, redistribution structures, printed circuit boards (PCBs), motherboards, or the like.

Figure 16:
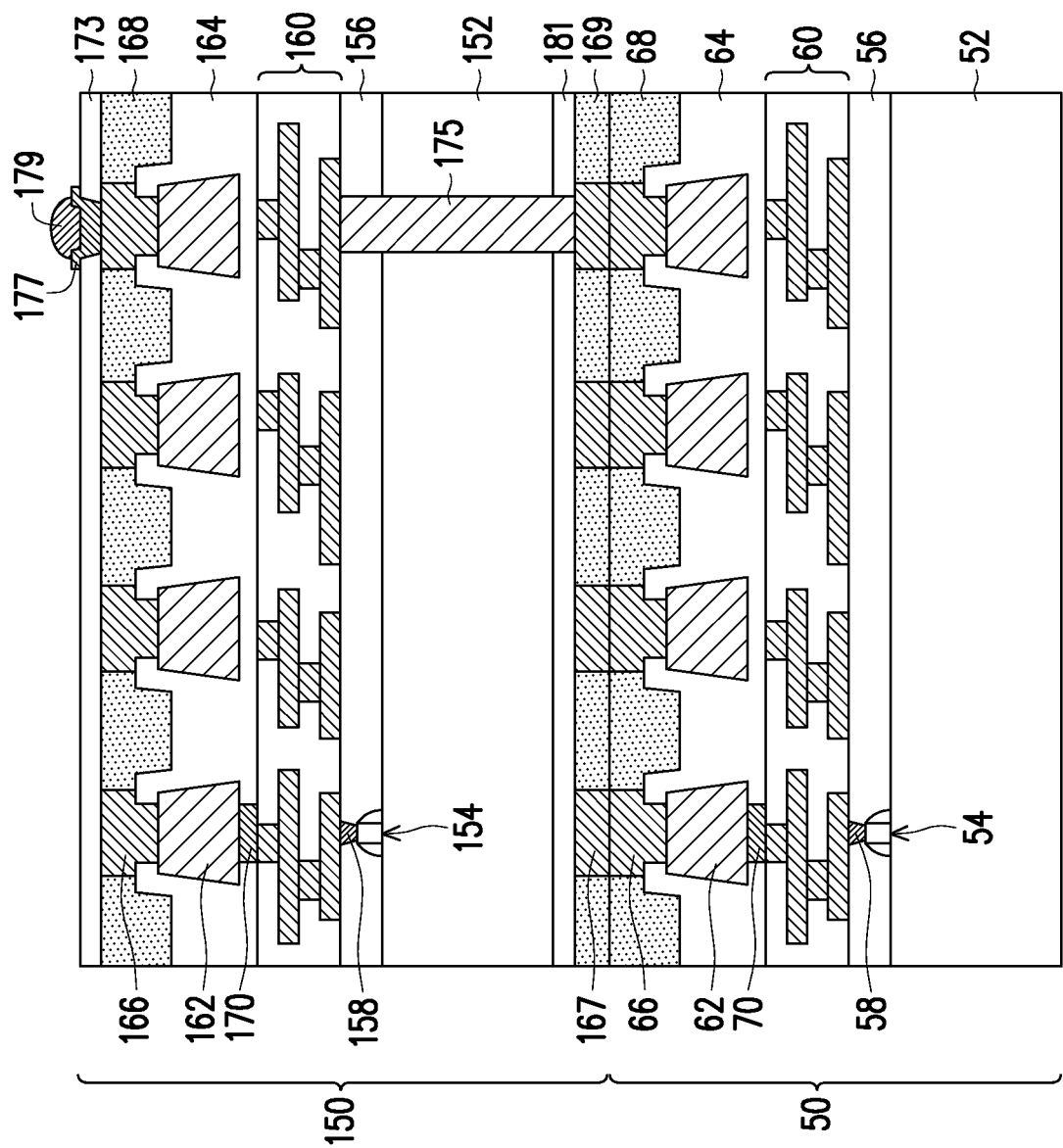

FIG. 16 shows a scheme of SoIC face-to-back (F2B) stacking of the second integrated circuit die 150 on the integrated circuit die 50, according to some embodiments. In F2B stacking, the front side of the integrated circuit die 50 is bonded to the back side of the second integrated circuit die 150. The integrated circuit die 50 and the second integrated circuit die 150 may be a logic device, such as a central processing unit (CPU), a graphics processing unit (GPU), a system-on-a-chip (SoC), a microcontroller, a memory device, such as a dynamic random access memory (DRAM) die, a static random access memory (SRAM) die, a hybrid memory cube (HMC) module, a high bandwidth memory (HBM) module, or the like. In some embodiments, the integrated circuit die 50 and the second integrated circuit die 150 may be the same type of dies, such as SoC dies. The integrated circuit die 50 and the second integrated circuit die 150 may be formed in processes of a same technology node, or may be formed in processes of different technology nodes. For example, the integrated circuit die 50 may be of a more advanced process node than the second integrated circuit die 150, and vice versa. The integrated circuit die 50 and the second integrated circuit die 150 may have different sizes (e.g., different heights and/or surface areas), or may have the same size (e.g., same heights and/or surface areas). Other combinations of integrated circuit dies are also possible in other embodiments.

In the second integrated circuit die 150, the semiconductor substrate 152, the devices 154, the ILD 156, the conductive plugs 158, the interconnect structure 160, the pads 162, the passivation layers 164, the die connectors 166, the bonding layers 168, and the vias 170 may be formed in similar ways to the semiconductor substrate 52, the devices 54, the ILD 56, the conductive plugs 58, the interconnect structure 60, the pads 62, the passivation layers 64, the die connectors 66, the bonding layers 68, and the vias 70 of the integrated circuit die 50, respectively.

The second integrated circuit die 150 may further include through substrate vias (TSVs) 175, a dielectric layer 181, bonding layers 169, and die connectors 167. Initially, the TSVs 175 may only partially extend through the semiconductor substrate 152. A carrier substrate (not shown) may be bonded to the top of the die connectors 166 and the bonding layers 168 by one or more additional bonding layers (not shown) using suitable processes. The one or more additional bonding layers may comprise silicon oxide (e.g., a high density plasma (HDP) oxide, or the like) that is deposited by CVD, ALD, PVD, or the like. The carrier substrate may be a glass carrier substrate, a ceramic carrier substrate, a wafer (e.g., a silicon wafer), or the like. The carrier substrate may provide structural support during subsequent processing steps and in the completed device.

After the carrier substrate is bonded to the top of the die connectors 166 and the bonding layers 168, the second integrated circuit die 150 may be flipped such that the back side of the second integrated circuit die 150 faces upwards. Then, the semiconductor substrate 152 may be thinned to expose the TSVs 175, and the semiconductor substrate 152 may further be thinned such that the TSVs 175 protrude from the semiconductor substrate 152. The dielectric layer 181 may be deposited over the semiconductor substrate 52 and around the TSVs 175. The dielectric layer 181 may comprise a dielectric material, such as a low-k dielectric material, an extra low-k (ELK) dielectric material, or the like. The dielectric layer 181 may be deposited using an appropriate process, such as, CVD, ALD, PVD, PECVD, or the like. The bonding layers 169 may be made of any suitable material for direct bonding such as an oxide (e.g., silicon oxide), a nitride (e.g., silicon nitride), an oxynitride (e.g., silicon oxynitride), or the like. The bonding layers 169 may be formed over the dielectric layer 181, for example, by spin coating, chemical vapor deposition (CVD), atomic layer deposition (ALD), or the like.

In some embodiments, the die connectors 167 may be formed using a damascene process in which the bonding layers 169 are patterned utilizing a combination of photolithography and etching techniques to form trenches corresponding to the desired pattern of the die connectors 167. An optional diffusion barrier and/or optional adhesion layer may be deposited and the trenches may then be filled with a conductive material. In an embodiment, the die connectors 167 may be formed by depositing a seed layer of copper or a copper alloy, and filling the trenches by electroplating.

In some embodiments, the TSVs 175 may be formed using another damascene process in which the dielectric layer 181, the semiconductor substrate 152, and the ILD 156 are patterned utilizing a combination of photolithography and etching techniques to form trenches corresponding to the desired pattern of the TSVs 175. An optional diffusion barrier and/or optional adhesion layer may be deposited and the trenches may then be filled with a conductive material. In an embodiment, the TSVs 175 may be formed by depositing a seed layer of copper or a copper alloy, and filling the trenches by electroplating.

Next, the integrated circuit die 50 and the second integrated circuit die 150 may be bonded to each other through the die connectors 66 and 167 and through the bonding layers 68 and 169 using similar processes as described with respect to FIG. 14. Then, the carrier substrate may be removed.

Passivation layers 173, UBMs 177, and external connectors 179 may be formed over the die connectors 166 and bonding layers 168. The passivation layers 173 may comprise polymers such as PBO, polyimide, BCB, or the like. Alternatively, the passivation layers 173 may include non-organic dielectric materials such as silicon oxide, silicon nitride, silicon carbide, silicon oxynitride, or the like. The passivation layers 173 may be deposited by, for example, CVD, PVD, ALD, or the like.

The UBMs 177 may be formed through the passivation layers 173 to the die connectors 166 and external connectors 179 are formed on the UBMs 177. The UBMs 177 may comprise one or more layers of copper, nickel, gold, or the like, which are formed by a plating process, or the like. The external connectors 179 (e.g., solder balls) are formed on the UBMs 177. The formation of the external connectors 179 may include placing solder balls on exposed portions of the UBMs 177 and reflowing the solder balls. The UBMs 177 and the external connectors 179 may be used to provide input/output connections to other electrical components, such as, other device dies, redistribution structures, printed circuit boards (PCBs), motherboards, or the like.

Figure 17:
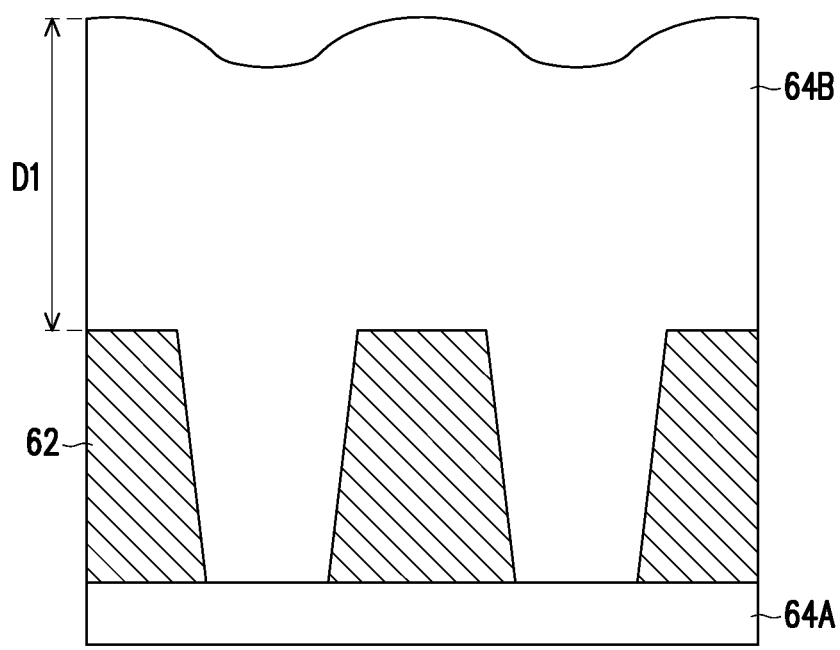
FIGS. 17 through 29 illustrate cross-sectional views of intermediate steps for forming a semiconductor package in accordance with some embodiments.
Figure 18:
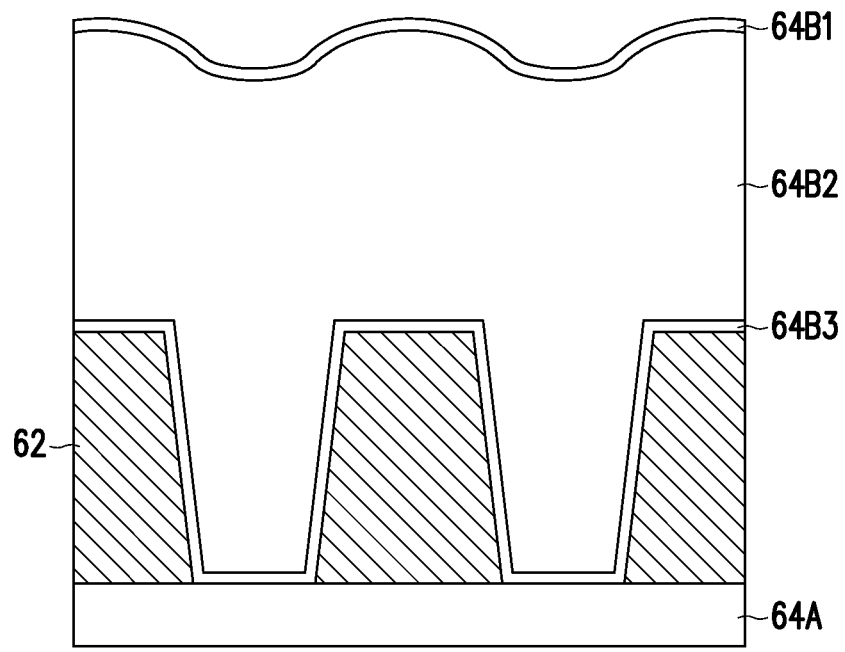
Figure 19:
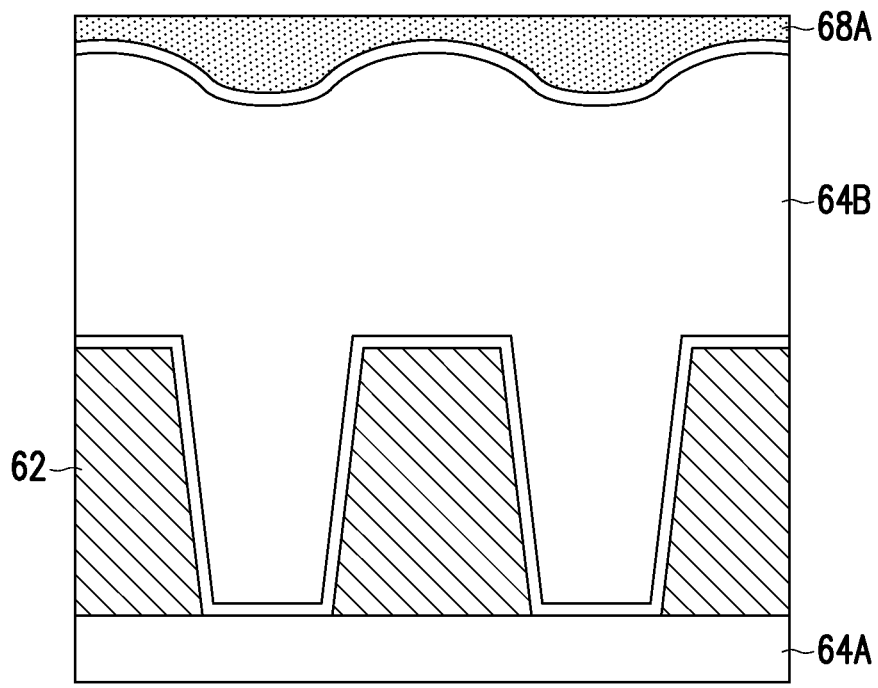

FIGS. 2 through 16 illustrate embodiments of removing the seams 72 in the first bonding layer 68A, where an additional thinning process is applied to create openings 73 from the seams 72 in the first bonding layer 68A, and the bonding material is then re-deposited to fill the openings 73. FIGS. 17 through 29 illustrate various alternative embodiments of forming semiconductor packages with the seamless first bonding layer 68A. FIGS. 17 through 19 illustrate first alternative embodiments by increasing the thickness of the second passivation layer 64B. FIGS. 20 through 29 illustrate second alternative embodiments by applying one or more additional thinning processes to the second passivation layer 64B. Particularly, FIGS. 20 through 23 illustrate a first option of the second alternative embodiments, where one additional thinning process is applied to the second passivation layer 64B. FIGS. 24 through 29 illustrate a second option of the second alternative embodiments, where two additional thinning processes are applied to the second passivation layer 64B.

In the first alternative embodiments, FIG. 17 may continue from FIG. 3A, where the second passivation layer 64B may be deposited over the pads 62 and over the first passivation layer 64A. In FIG. 17, the material (e.g., silicon oxide (e.g., silicon dioxide ($SiO_2$)), silicon nitride (SiN), the like, or combinations thereof) for the second passivation layer 64B may continue to be deposited to increase the thickness of the second passivation layer 64B. Further, the second passivation layer 64B may include one or more sublayers (e.g., three sublayers) deposited using materials such as the ones described with respect to FIG. 18. In some embodiments, the thickness D1 of the second passivation layer 64B may be increased by 0.1 μm and 3.5 μm, as compared to the thickness of the second passivation layer 64B in FIG. 3A. The thickness D1 of the second passivation layer 64B may range from 0.5 μm to 4 μm. In addition, as shown in FIG. 17, all of the top edge of the second passivation layer 64B is completely above the top edges of the pads 62. In contrast, in FIG. 3A, portions of the top edge of the second passivation layer 64B are below the top edges of the pads 62.

FIG. 18 shows example detailed embodiments of increasing the thickness of the second passivation layer 64B described with respect to FIG. 17. The second passivation layer 64B may include 3 sublayers: the sublayer 64B1, the sublayer 64B2, and the sublayer 64B3. The sublayer 64B3 may include silicon oxide, or the like. The sublayer 64B3 may be deposited over the pads 62 and over the first passivation layer 64A by CVD or the like. The sublayer 64B2 may include silicon oxide, or the like. The sublayer 64B2 may be deposited over the sublayer 64B3 by HDP-CVD. The density of the sublayer 64B2 may be higher than that of the sublayer 64B3. The sublayer 64B1 may include silicon nitride (SiN), or the like. The sublayer 64B1 may be deposited over the sublayer 64B2 by CVD. In some embodiments, the increase in the thickness of the second passivation layer 64B may all come from the increase in the thickness of the sublayer 64B2. In some embodiments, the thickness of the sublayer 64B2 may range from 0.5 μm to 4 μm. Further, all of the top edge of the sublayer 64B2 may be completely above the top edges of the pads 62.

In FIG. 19, the first bonding layer 68A of bonding layers 68 is deposited over the second passivation layer 64B. In some embodiments, the first bonding layer 68A may comprise silicon oxide (e.g., silicon dioxide ($SiO_2$)), silicon nitride (SiN), or silicon oxynitride (SiON), the like, or combinations thereof, and may be deposited by CVD, ALD, PVD, or the like. By increasing the thickness of the second passivation layer 64B, the second passivation layer 64B does not have openings with high height-to-width ratios (e.g., as a result of the second passivation layer 64B filling a space between the pads 62). Accordingly, after the first bonding layer 68A is deposited over the second passivation layer 64B, the first bonding layer 68A does not include any seams enclosed by the first bonding layer 68A. Next, a thinning process may be applied to the first bonding layer 68A. The thinning process may be a planarization process such as a chemical mechanical polish (CMP), an etch-back, combinations thereof, or the like. After planarization, the top surface of the first bonding layer 68A may be flat. After the steps described with respect to FIG. 19, the process may continue with FIGS. 9-16. For example, the embodiments of FIG. 19 may be integrated into the F2F bonding schematic of FIG. 15 or the F2B bonding schematic of FIGS. 16.

Figure 20:
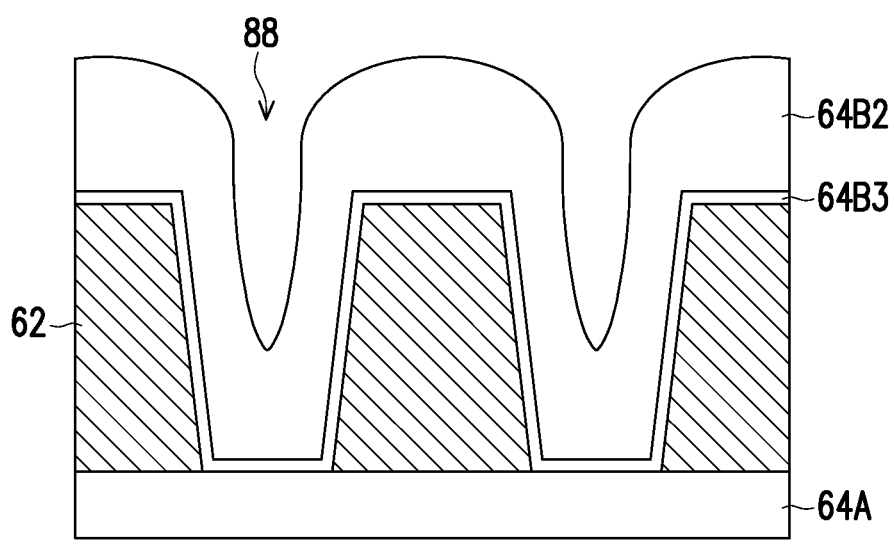

FIGS. 20 through 23 illustrate the first option of the second alternative embodiments, where one additional thinning process is applied to the second passivation layer 64B. FIG. 20 may continue from FIG. 3A. In FIG. 20, the sublayer 64B3 of the second passivation layer 64B may be deposited over the pads 62 and over the first passivation layer 64A by CVD. The sublayer 64B3 may include silicon oxide, or the like. The sublayer 64B2 may be deposited over the sublayer 64B3 by HDP-CVD. The sublayer 64B2 may include silicon oxide, or the like. The density of the sublayer 64B2 may be higher than that of the sublayer 64B3. As shown in FIG. 20, the height-to-width ratio of the opening 88 in the sublayer 64B2 is relatively high. In some embodiment, the height-to-width ratio of the opening 88 may be the same or similar to the height-to-width ratio of 71 in FIG. 3A.

Figure 21:
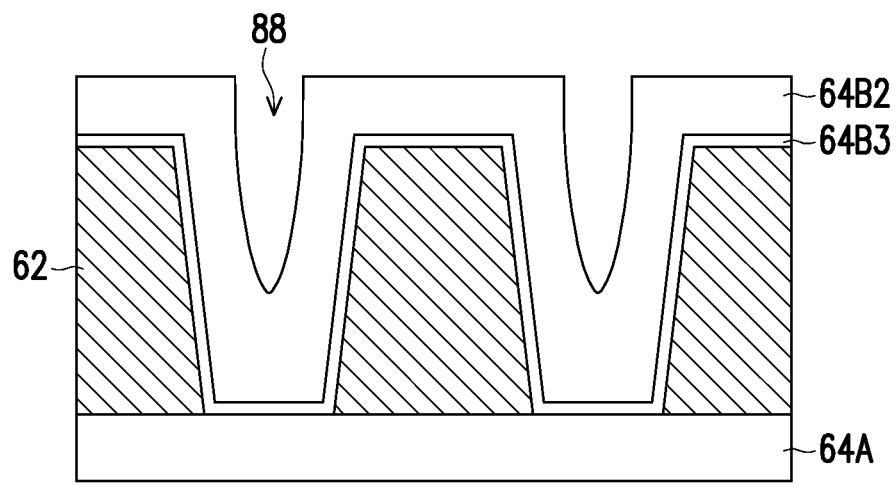

In FIG. 21, before the sublayer 64B1 of the second passivation layer 64B is deposited, a thinning process may be applied to the sublayer 64B2 of the second passivation layer 64B. The thinning process may be a planarization process such as a chemical mechanical polish (CMP), an etch-back, combinations thereof, or the like. The thinning process may reduce the thickness of the sublayer 64B2 and reduce the height-to-width ratio of the opening 88 in the sublayer 64B2.

Figure 22:
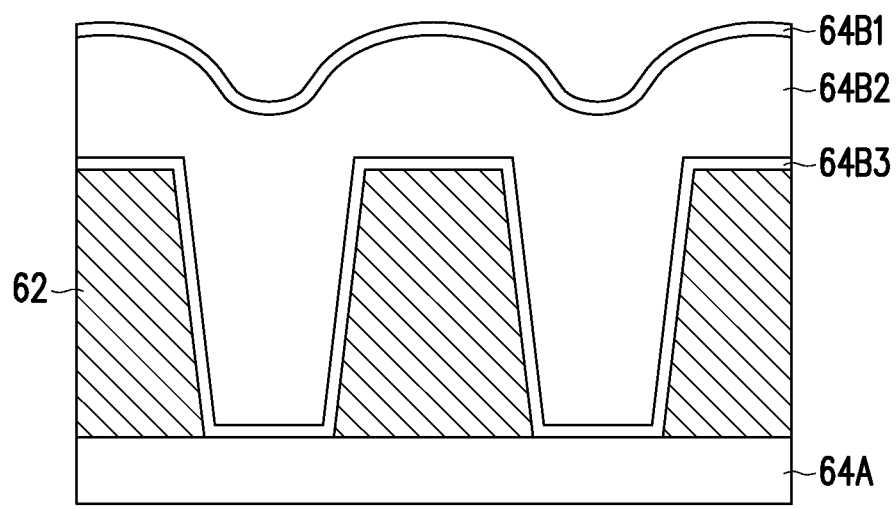

In FIG. 22, the sublayer 64B2 may continue to be deposited. The sublayer 64B2 may comprise silicon oxide, or the like, deposited by HDP-CVD. As shown in FIG. 22, all of the top edge of the sublayer 64B2 is completely above the top edges of the pads 62. The relatively low height-to-width ratio of the opening 88 after the thinning process prevents the possibility of formation of seams inside the sublayer 64B2 of the second passivation layer 64B. Then, the sublayer 64B1 of the second passivation layer 64B may be deposited over the sublayer 64B2 by CVD. The sublayer 64B1 may comprise silicon nitride (SiN), or the like.

Figure 23:
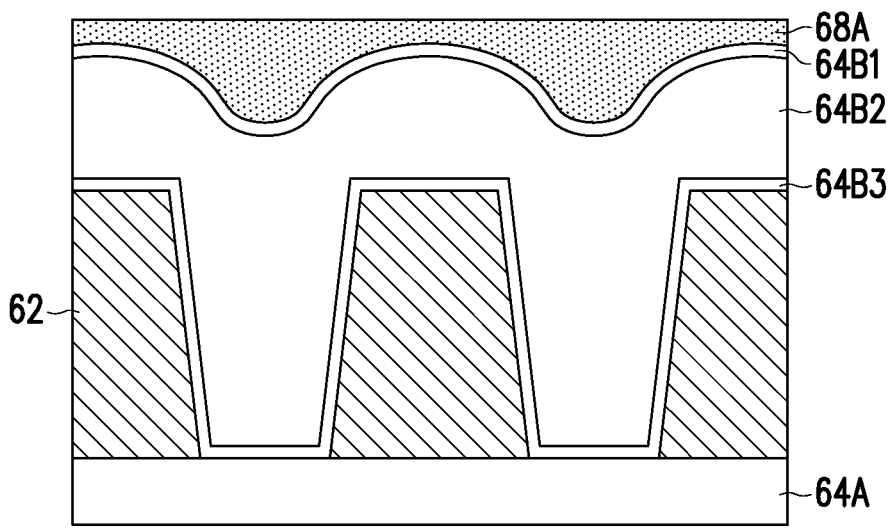

In FIG. 23, the first bonding layer 68A of bonding layers 68 is deposited over the second passivation layer 64B. In some embodiments, the first bonding layer 68A may comprise silicon oxide (e.g., silicon dioxide ($SiO_2$)), silicon nitride (SiN), or silicon oxynitride (SiON), the like, or combinations thereof, and may be deposited by CVD, ALD, PVD, or the like. Next, a thinning process may be applied to the first bonding layer 68A. The thinning process may be a planarization process such as a chemical mechanical polish (CMP), an etch-back, combinations thereof, or the like. After planarization, a top surface of the first bonding layer 68A may be flat.

After the steps described with respect to FIG. 23, the process may continue with FIGS. 9-16. For example, the embodiments of FIG. 19 may be integrated into the F2F bonding schematic of FIG. 15 or the F2B bonding schematic of FIGS. 16.

Figure 24:
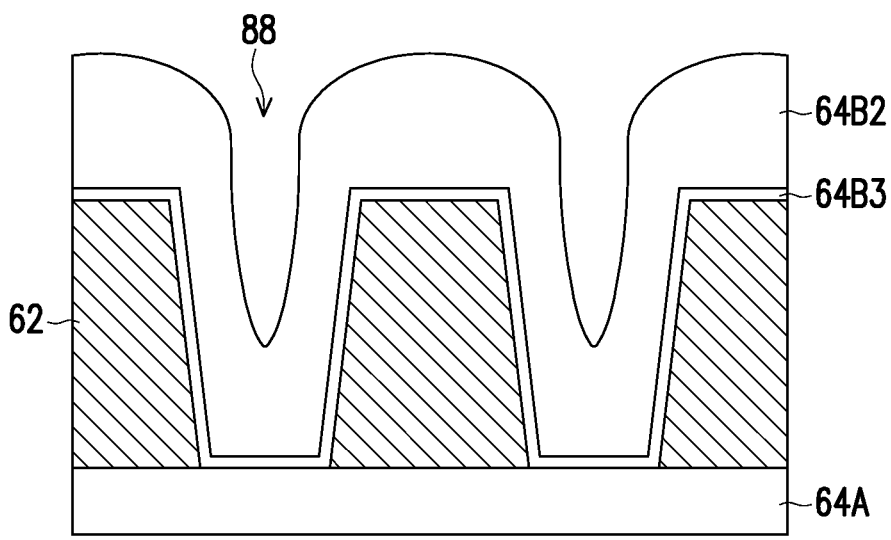
Figure 25:
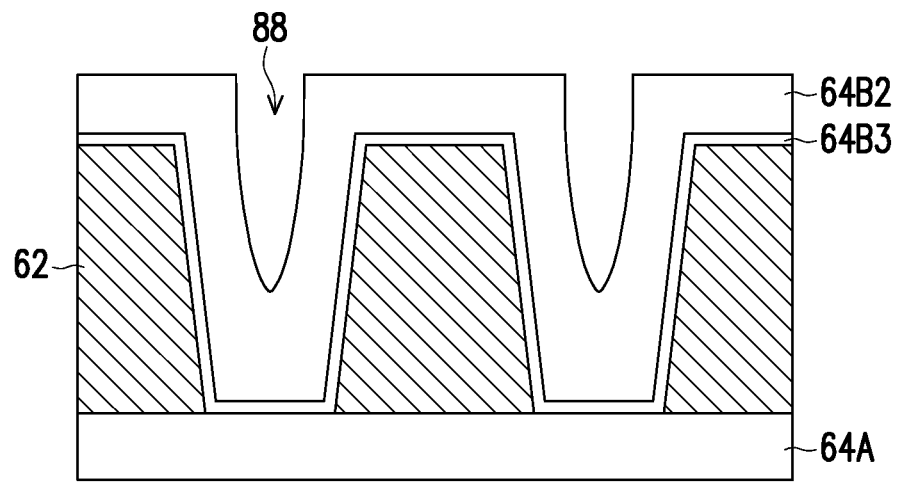

FIGS. 24 through 29 illustrate the second option of the second alternative embodiments, where two additional thinning processes are applied to the second passivation layer 64B. FIG. 24 may continue from FIG. 3A. Further, the steps in FIGS. 24 and 25 may be similar to or the same as the steps described above with respect to FIGS. 20 and 21, respectively.

Figure 26:
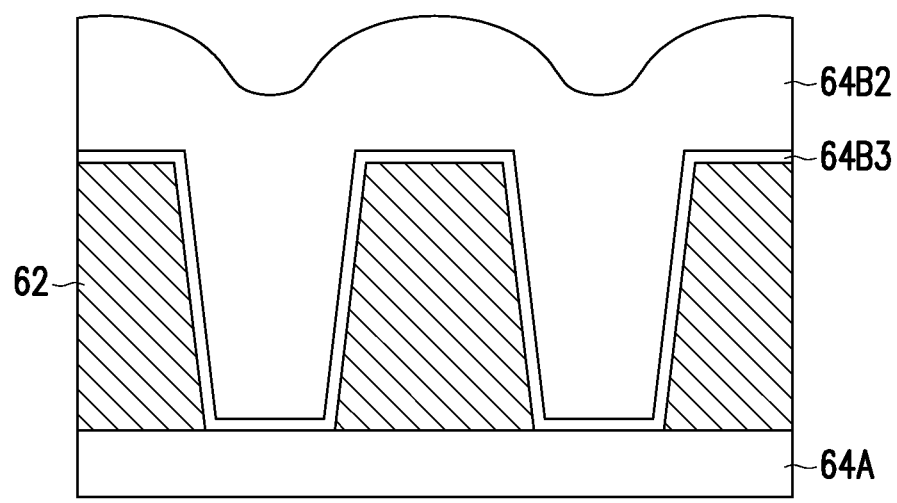

In FIG. 26, the sublayer 64B2 may continue to be deposited. The sublayer 64B2 may comprise silicon oxide, or the like, deposited by HDP-CVD. As shown in FIG. 26, all of the top edge of the sublayer 64B2 is completely above the top edges of the pads 62.

Figure 27:
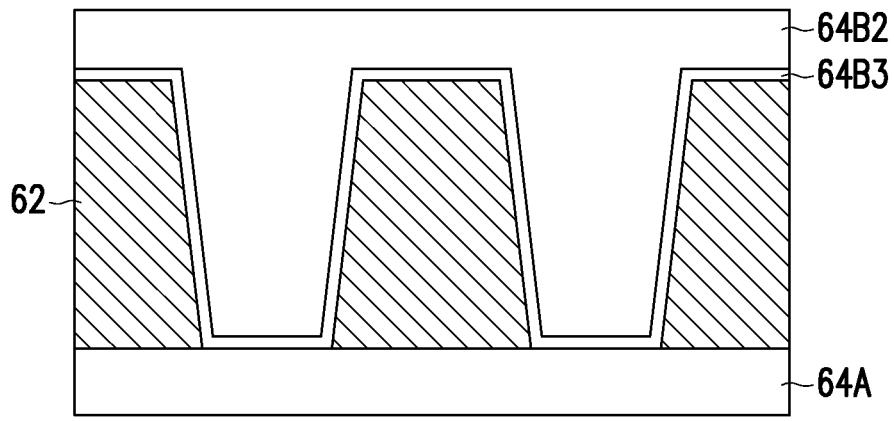

In FIG. 27, before the sublayer 64B1 of the second passivation layer 64B is deposited, a second thinning process may be applied to the sublayer 64B2 of the second passivation layer 64B. The second thinning process may be a planarization process such as a chemical mechanical polish (CMP), an etch-back, combinations thereof, or the like. After planarization, the thickness of the sublayer 64B2 of the second passivation layer 64B may be reduced. Further, the top edge of the sublayer 64B2 of the second passivation layer 64B may be flat, and the top edge of the sublayer 64B2 may still be above the top edges of the pads 62.

Figure 28:
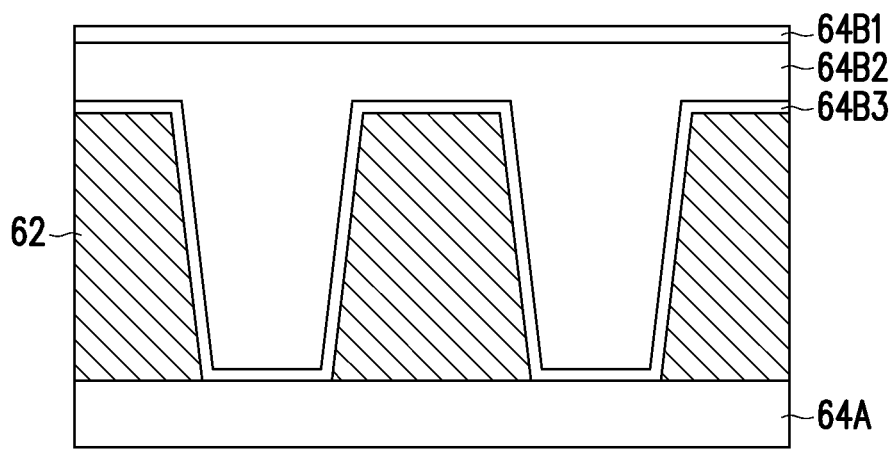

In FIG. 28, the sublayer 64B1 of the second passivation layer 64B may be deposited over the sublayer 64B2. The sublayer 64B1 may comprise silicon nitride (SiN), or the like, deposited by CVD. In addition, a thinning process may be applied to the sublayer 64B1. The thinning process applied to the sublayer 64B1 may be a planarization process such as a chemical mechanical polish (CMP), an etch-back, combinations thereof, or the like.

Figure 29:
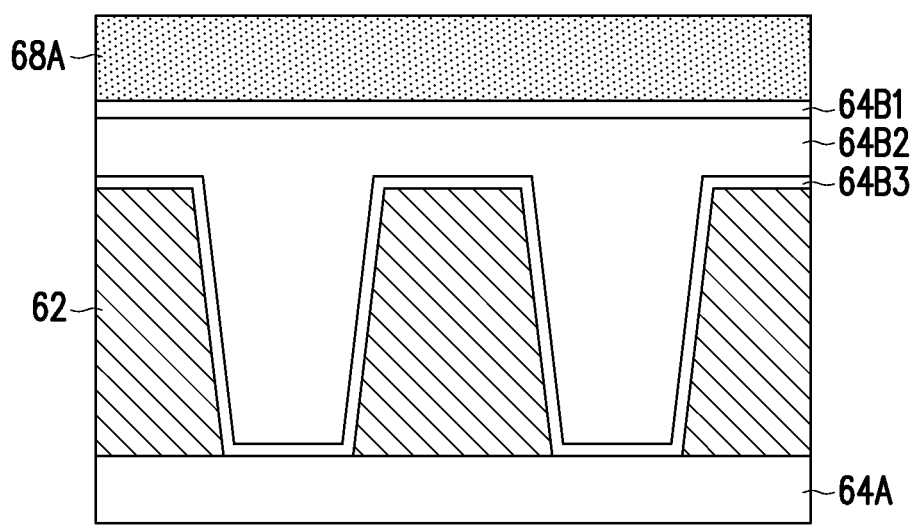

In FIG. 29, the first bonding layer 68A of bonding layers 68 is deposited over the second passivation layer 64B. In some embodiments, the first bonding layer 68A may comprise silicon oxide (SiN), or silicon oxynitride (SiON), the like, or combinations thereof, and may be deposited by CVD, ALD, PVD, or the like. Next, a thinning process may be applied to the first bonding layer 68A. The thinning process may be a planarization process such as a chemical mechanical polish (CMP), an etch-back, combinations thereof, or the like. After planarization, a top surface of the first bonding layer 68A may be flat.

After the steps described with respect to FIG. 29, the process may continue with FIGS. 9-16. For example, the embodiments of FIG. 19 may be integrated into the F2F bonding schematic of FIG. 15 or the F2B bonding schematic of FIGS. 16.

Various embodiments include a bonding layer containing no seams in integrated circuit dies and/or die stacks directly bonded thereto. In some embodiments, an additional thinning process may be used to the bonding layer to create an opening from the seam in the bonding layer. The bonding material may then be re-deposited to fill the opening. In other alternative embodiments, before depositing the bonding layer, a passivation layer is formed such that the top edge of the passivation layer is completely above the metal pads. Various embodiments may achieve one or more of the following, non-limiting advantages: improved mechanical endurance; improved electrical performance; reduced defects; and increased yield.

In accordance with embodiments, a method includes forming a second passivation layer over a first metal pad and a second metal pad. The first metal pad and the second metal pad are disposed over a first passivation layer of a first semiconductor die. The method also includes depositing a first bonding material over the second passivation layer to form a first portion of a first bonding layer. At least a portion of a seam in the first bonding layer is between the first metal pad and the second metal pad. The method further includes thinning the first portion of the first bonding layer to create a first opening from the seam and re-depositing the first bonding material to fill the first opening and to form a second portion of the first bonding layer. In an embodiment, thinning the first portion of the first bonding layer may include forming an etching mask over the first portion of the first bonding layer and etching the first portion of the first bonding layer through the second opening in the etching mask. The etching mask may be patterned to include a second opening that overlaps the seam. In an embodiment, the method may further include applying a planarization process to the first bonding layer; forming a second bonding layer over the first bonding layer; forming a first bonding pad above and electrically connected to the first metal pad; and bonding a second semiconductor die to the first semiconductor die with a dielectric-to-dielectric bond and a metal-to-metal bond. A top surface of the first bonding pad and a top surface of the second bonding layer may be level. In an embodiment, the first metal pad and the second metal pad may be made of aluminum, and the first bonding pad may be made of copper. In an embodiment, the second bonding layer may include a first sublayer made of silicon nitride and a second sublayer made of silicon oxide. In an embodiment, the first bonding pad may be electrically connected to the first metal pad through a bonding via. In an embodiment, bonding the second semiconductor die may include bonding a bottom surface on a front side of the second semiconductor die to the top surface of the second bonding layer on a front side of the first die. In an embodiment, bonding the second semiconductor die may include bonding a bottom surface on a back side of the second semiconductor die to the top surface of the second bonding layer on a front side of the first die.

In accordance with embodiments, a package includes a first semiconductor die. The first semiconductor die includes a semiconductor substrate, a semiconductor device at a top surface of the semiconductor substrate an interconnect structure electrically connected to the semiconductor device, a plurality of metal pads over the interconnect structure, a first passivation layer over the plurality of metal pads, a first bonding layer over the first passivation layer. A top edge of the first passivation layer is completely above and continuously covers the plurality of metal pads, and the first bonding layer is free of any seams between any two of the plurality of metal pads. The first semiconductor die further includes a second bonding layer over the first bonding layer and a bonding pad above and electrically connected one of the plurality of metal pads. The package also includes a second semiconductor die bonded to the first semiconductor die with a dielectric-to-dielectric bond and a metal-to-metal bond. In an embodiment, a portion of the first passivation layer and a portion of the first bonding layer may completely fill a lateral space between any two of the plurality of metal pads. In an embodiment, a portion of the first passivation layer may completely fill a lateral space between any two of the plurality of metal pads. In an embodiment, the first passivation layer may include a first sublayer made of a first material and over the plurality of metal pads and over the first passivation layer. A second sublayer may be made of a second material and over the first sublayer, and a third sublayer may be made of a third material and over the second sublayer. A top edge of the second sublayer may be completely above top edges of the plurality of metal pads, and a top edge of the first sublayer may be partially below the top edges of the plurality of metal pads. In an embodiment, a density of the second sublayer may be higher than a density of the first sublayer.

In accordance with embodiments, a method includes forming a plurality of metal pads over a device layer of a semiconductor substrate and forming a second passivation layer over the plurality of metal pads and over a first passivation layer of a first semiconductor die. A top edge of the second passivation layer is completely above the plurality of metal pads. Forming the second passivation layer includes completely filling a gap between a first metal pad and a second metal pad of the plurality of metal pads with a portion of the second passivation layer. The method also includes depositing a first bonding material over the second passivation layer to form a first bonding layer. In an embodiment, the second passivation layer may include a first sublayer made of a first material and over the plurality of metal pads and over the first passivation layer, a second sublayer may be made of a second material and over the first sublayer, a third sublayer may be made of a third material and over the second sublayer. A density of the second sublayer may be higher than a density of the first sublayer. In an embodiment, the first sublayer may be made of silicon oxide using a first chemical vapor deposition (CVD) process, the second sublayer may be made of silicon oxide using a high-density plasma (HDP)-CVD process, and the third sublayer may be made of silicon nitride using a second CVD process. In an embodiment, forming the second passivation layer may include forming the second passivation layer such that a thickness of the second passivation layer is in a range of 0.5 µm and 4 µm. In an embodiment, forming the second passivation layer may include depositing the first material to form the first sublayer; depositing the second material over the first sublayer to form the second sublayer; applying a planarization process to the second sublayer to reduce a thickness of the second sublayer and to reduce a height of an opening between two of the plurality of metal pads; re-depositing the second material to fill the opening; and depositing the third material over the second sublayer to form the third sublayer. In an embodiment, the method may further include applying a second planarization process to the second sublayer. In an embodiment, a top edge of the second sublayer may be completely above the plurality of metal pads, and a top edge of the third sublayer may be partially below the top edges of the plurality of metal pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a second passivation layer over a first metal pad and a second metal pad, the first metal pad and the second metal pad being disposed over a first passivation layer of a first semiconductor die;
    depositing a first bonding material over the second passivation layer to form a first portion of a first bonding layer, wherein at least a portion of a seam in the first bonding layer is between the first metal pad and the second metal pad;
    thinning the first portion of the first bonding layer to create a first opening from the seam; and
    re-depositing the first bonding material to fill the first opening and to form a second portion of the first bonding layer.

2. The method of claim 1, wherein thinning the first portion of the first bonding layer comprises:
    forming an etching mask over the first portion of the first bonding layer, wherein the etching mask is patterned to include a second opening that overlaps the seam; and
    etching the first portion of the first bonding layer through the second opening in the etching mask.

3. The method of claim 1, further comprising:
    applying a planarization process to the first bonding layer;
    forming a second bonding layer over the first bonding layer;
    forming a first bonding pad above and electrically connected to the first metal pad, wherein a top surface of the first bonding pad and a top surface of the second bonding layer are level; and
    bonding a second semiconductor die to the first semiconductor die with a dielectric-to-dielectric bond and a metal-to-metal bond.

4. The method of claim 3, wherein the first metal pad and the second metal pad are made of aluminum, and wherein the first bonding pad is made of copper.

5. The method of claim 3, wherein the second bonding layer includes a first sublayer made of silicon nitride and a second sublayer made of silicon oxide.

6. The method of claim 3, wherein the first bonding pad is electrically connected to the first metal pad through a bonding via.

7. The method of claim 3, wherein bonding the second semiconductor die comprises:
    bonding a bottom surface on a front side of the second semiconductor die to the top surface of the second bonding layer on a front side of the first semiconductor die.

8. The method of claim 3, wherein bonding the second semiconductor die comprises:

bonding a bottom surface on a back side of the second semiconductor die to the top surface of the second bonding layer on a front side of the first semiconductor die.

9. A package comprising:
a first semiconductor die including:
a semiconductor substrate;
a semiconductor device at a top surface of the semiconductor substrate;
an interconnect structure electrically connected to the semiconductor device;
a plurality of metal pads over the interconnect structure;
a first passivation layer over the plurality of metal pads, the first passivation layer is between at least two adjacent metal pads of the plurality of metal pads, the first passivation layer including a first sublayer, a second sublayer and a third sublayer, wherein the first sublayer comprises a first material having a first top edge that is partially below top edges of the at least two adjacent metal pads, the second sublayer comprises a second material having a second top edge that is completely above the top edges of the at least two adjacent metal pads, and the third sublayer is made of a third material and is over the second sublayer;
a first bonding layer over the first passivation layer, wherein a top edge of the first passivation layer is completely above and continuously covers the plurality of metal pads, and wherein the first bonding layer is free of any seams between any two of the plurality of metal pads;
a second bonding layer over the first bonding layer; and
a bonding pad above and electrically connected to one of the plurality of metal pads; and
a second semiconductor die bonded to the first semiconductor die with a dielectric-to-dielectric bond and a metal-to-metal bond.

10. The package of claim 9, wherein a portion of the first passivation layer completely fills a lateral space between any two of the plurality of metal pads.

11. The package of claim 9, wherein a density of the second sublayer is higher than a density of the first sublayer.

12. The package of claim 9, wherein the first bonding layer has a non-conformal thickness.

13. The package of claim 9, wherein the second bonding layer has a conformal thickness.

14. A method comprising:
forming a plurality of metal pads over a device layer of a semiconductor substrate;
forming a second passivation layer over the plurality of metal pads and over a first passivation layer of a first semiconductor die, wherein a top edge of the second passivation layer is completely above the plurality of metal pads, and forming the second passivation layer includes:
completely filling a gap between a first metal pad and a second metal pad of the plurality of metal pads with a portion of the second passivation layer, the second passivation layer including a first sublayer made of a first material over the plurality of the metal pads and a second sublayer made of a second material over the first sublayer, wherein a density of the second sublayer is higher than a density of the first sublayer; and
depositing a first bonding material over the second passivation layer to form a first bonding layer.

15. The method of claim 14, wherein the second passivation layer further comprises a third sublayer made of a third material and over the second sublayer.

16. The method of claim 15, wherein the first sublayer is made of silicon oxide using a first chemical vapor deposition (CVD) process, wherein the second sublayer is made of silicon oxide using a high-density plasma (HDP)-CVD process, and wherein the third sublayer is made of silicon nitride using a second CVD process.

17. The method of claim 15, wherein forming the second passivation layer comprises:
forming the second passivation layer such that a thickness of the second passivation layer is in a range of −0.5 μm and 4 μm.

18. The method of claim 15, wherein forming the second passivation layer comprises:
depositing the first material to form the first sublayer;
depositing the second material over the first sublayer to form the second sublayer;
applying a planarization process to the second sublayer to reduce a thickness of the second sublayer and to reduce a height of an opening between two of the plurality of metal pads;
re-depositing the second material to fill the opening; and
depositing the third material over the second sublayer to form the third sublayer.

19. The method of claim 18, further comprising:
applying a second planarization process to the second sublayer.

20. The method of claim 15, wherein a top edge of the second sublayer is completely above the plurality of metal pads, and wherein a top edge of the third sublayer is partially below the top edges of the plurality of metal pads.

* * * * *